(12) United States Patent
Kagawa et al.

(10) Patent No.: US 11,476,055 B2
(45) Date of Patent: Oct. 18, 2022

(54) THIN FILM CAPACITOR AND METHOD OF MANUFACTURING THE SAME

(71) Applicant: Murata Manufacturing Co., Ltd., Nagaokakyo (JP)

(72) Inventors: Takeshi Kagawa, Nagaokakyo (JP); Junko Izumitani, Nagaokakyo (JP); Masatomi Harada, Nagaokakyo (JP); Hiroshi Matsubara, Nagaokakyo (JP); Nobuhiro Ishida, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 265 days.

(21) Appl. No.: 16/681,887

(22) Filed: Nov. 13, 2019

(65) Prior Publication Data

US 2020/0082989 A1 Mar. 12, 2020

Related U.S. Application Data

(63) Continuation of application No. PCT/JP2018/027209, filed on Jul. 20, 2018.

(30) Foreign Application Priority Data

Jul. 31, 2017 (JP) .............................. JP2017-148330

(51) Int. Cl.
*H01G 4/33* (2006.01)
*H01G 4/012* (2006.01)
(Continued)

(52) U.S. Cl.
CPC ............... *H01G 4/33* (2013.01); *H01G 4/012* (2013.01); *H01G 4/228* (2013.01); *H01G 4/30* (2013.01);
(Continued)

(58) Field of Classification Search
CPC ............ H01G 4/33; H01G 4/228; H01G 4/30; H01G 4/012; H01L 21/822; H01L 27/04; H01L 28/56
(Continued)

(56) References Cited

U.S. PATENT DOCUMENTS 6,212,057 B1 * 4/2001 Kohara ..................... H01G 4/08
361/306.3
7,161,793 B2  1/2007 Kurihara et al.
(Continued)

FOREIGN PATENT DOCUMENTS

JP   2004214589 A   7/2004
JP   2008004734 A   1/2008
(Continued)

OTHER PUBLICATIONS

International Search Report issued in PCT/JP2018/027209, dated Oct. 9, 2018.
(Continued)

*Primary Examiner* — Arun Ramaswamy
(74) *Attorney, Agent, or Firm* — ArentFox Schiff LLP

(57) ABSTRACT

A capacitor that includes a lower electrode; a dielectric film; an upper electrode; a first protective film that has a first through hole that opens to the upper electrode and a second through hole that opens to the lower electrode, and has a first upper surface; a second protective film that has a second upper surface located higher than the first upper surface of the first protective film; a first terminal electrode electrically connected to the upper electrode through the first through hole, and extends to at least the second upper surface of the second protective film; and a second terminal electrode electrically connected to the lower electrode through the second through hole, and extends to at least the second upper surface of the second protective film.

17 Claims, 20 Drawing Sheets

(51) Int. Cl.
   *H01G 4/228* (2006.01)
   *H01G 4/30* (2006.01)
   *H01L 21/822* (2006.01)
   *H01L 27/04* (2006.01)
   *H01L 49/02* (2006.01)

(52) U.S. Cl.
   CPC ............ *H01L 21/822* (2013.01); *H01L 27/04* (2013.01); *H01L 28/56* (2013.01)

(58) Field of Classification Search
   USPC .......... 361/311, 312, 306.1, 307, 301.4, 313
   See application file for complete search history.

(56) References Cited

U.S. PATENT DOCUMENTS

| | | | |
|---|---|---|---|
| 2004/0130849 A1 | 7/2004 | Kurihara et al. | |
| 2008/0080122 A1* | 4/2008 | Togashi | H01G 4/2325 361/303 |
| 2009/0166074 A1* | 7/2009 | Furuya | H01G 4/228 174/260 |
| 2013/0094120 A1 | 4/2013 | Sasajima et al. | |
| 2015/0280016 A1* | 10/2015 | Yamamoto | H01L 29/94 257/532 |
| 2016/0163463 A1* | 6/2016 | Namikawa | H01G 4/008 361/301.3 |

FOREIGN PATENT DOCUMENTS

| | | |
|---|---|---|
| JP | 2009010114 A | 1/2009 |
| JP | 2011228462 A | 11/2011 |

OTHER PUBLICATIONS

Written Opinion of the International Searching Authority issued in PCT/JP2018/027209, dated Oct. 9, 2018.

* cited by examiner

THIN FILM CAPACITOR AND METHOD OF MANUFACTURING THE SAME

CROSS REFERENCE TO RELATED APPLICATIONS

The present application is a continuation of International application No. PCT/JP2018/027209, filed Jul. 20, 2018, which claims priority to Japanese Patent Application No. 2017-148330, filed Jul. 31, 2017, the entire contents of each of which are incorporated herein by reference.

FIELD OF THE INVENTION

The present invention relates to a thin film capacitor and a method of manufacturing the same.

BACKGROUND OF THE INVENTION

A thin film capacitor is formed, for example, by a MIM (Metal-Insulator-Metal) structure in which a lower electrode, a dielectric layer, and an upper electrode are sequentially stacked on a substrate. Various configurations of thin film capacitors have been studied in order to suppress a decrease in reliability due to hydrogen deterioration, solder mounting failure, or the like.

For example, Patent Document 1 discloses a thin-film capacitor that suppresses hydrogen deterioration while suppressing a decrease in IV characteristics as compared with an electrode using Pt, by using at least a stacked electrode in which nitride and metal are stacked as an upper electrode. At this time, the upper surface of the upper electrode is covered with a protective film and photosensitive resin, and a buried conductor is provided in the protective film and the photosensitive resin. The lower electrode and the upper electrode are each connected to an external electrode provided on the upper surface of the photosensitive resin through the buried conductor.

Patent Document 1: Japanese Patent Application Laid-Open No. 2011-228462

SUMMARY OF THE INVENTION

However, as disclosed in Patent Document 1, when the thin film capacitor in which the terminal electrode is provided on the protective film and the insulating layer is reduced in size, a solder fixing force necessary for stable mounting may not be obtained due to the reduction in the area of the terminal electrode. Further, there has been a problem that the solder is not formed in a fillet shape and the mounting posture of the thin film capacitor is not stable. Such solder mounting failure may cause a deterioration in reliability such as dropping of the thin film capacitor upon impact or interference with other components.

The present invention has been made in view of such circumstances, and an object of the present invention is to provide a thin film capacitor capable of improving reliability.

According to one embodiment of the present invention, there is provided a thin film capacitor that includes a lower electrode; a dielectric film on the lower electrode; an upper electrode that faces the lower electrode with the dielectric film interposed therebetween; a first protective film on the dielectric film and the upper electrode, and that defines a first through hole that opens to the upper electrode and a second through hole that opens to the lower electrode, and that has a first upper surface that defines a height of each of the first through hole and the second through hole; a second protective film located in a part of a region in a plan view defined by the first upper surface of the first protective film, and having a second upper surface located higher than the first upper surface of the first protective film; a first terminal electrode electrically connected to the upper electrode through the first through hole, and extending to at least the second upper surface of the second protective film; and a second terminal electrode electrically connected to the lower electrode through the second through hole, and extending to at least the second upper surface of the second protective film.

According to another embodiment of the present invention, there is provided a method of manufacturing a thin film capacitor, the method including providing a lower electrode; covering the lower electrode with a dielectric film; providing an upper electrode on the dielectric film so as to face the lower electrode; providing a first protective film on the dielectric film and the upper electrode, the first protective film defining a first through hole that opens to the upper electrode and a second through hole that opens to the lower electrode, and having a first upper surface that defines a height of each of the first through hole and the second through hole; providing a second protective film in a part of a region in a plan view defined by the first upper surface of the first protective film, and having a second upper surface located higher than the first upper surface of the first protective film; electrically connecting a first terminal electrode and a second terminal electrode to the upper electrode and the lower electrode through the first through hole and the second through hole, respectively, each of the first terminal electrode and the second terminal electrode extending to at least the second upper surface of the second protective film.

According to the present invention, a thin film capacitor with improved reliability can be provided.

DETAILED DESCRIPTION OF THE INVENTION

Hereinafter, embodiments of the present invention will be described with reference to the drawings. However, in each of in the second and subsequent embodiments, description of the same or similar components as those of the first embodiment will be omitted as appropriate. In addition, descriptions of effects similar to those of the first embodiment among effects obtained in the second and subsequent embodiments will be omitted as appropriate. The drawings of the respective embodiments are exemplifications, the dimensions and shapes of the respective parts are schematic, and the technical scope of the invention of the present application should not be interpreted as being limited to the embodiments.

Each drawing has an orthogonal coordinate system (XYZ coordinate) consisting of an X-axis, a Y-axis, and a Z-axis for the sake of convenience in order to clarify the relationship between the drawings and to help understand the positional relationship of each member. The direction parallel to the X axis is called an "X-axis direction". The same applies to a direction parallel to another axis. In the following description, the Z-axis positive direction side is referred to as "up" (upward). The X-axis direction is not limited to the positive direction of the arrow, and includes the negative direction opposite to the arrow. A plane parallel to the plane specified by the X axis and the Y axis is referred to as an "XY plane". The same applies to a plane parallel to a plane specified by another axis.

First Embodiment

Figure 1:
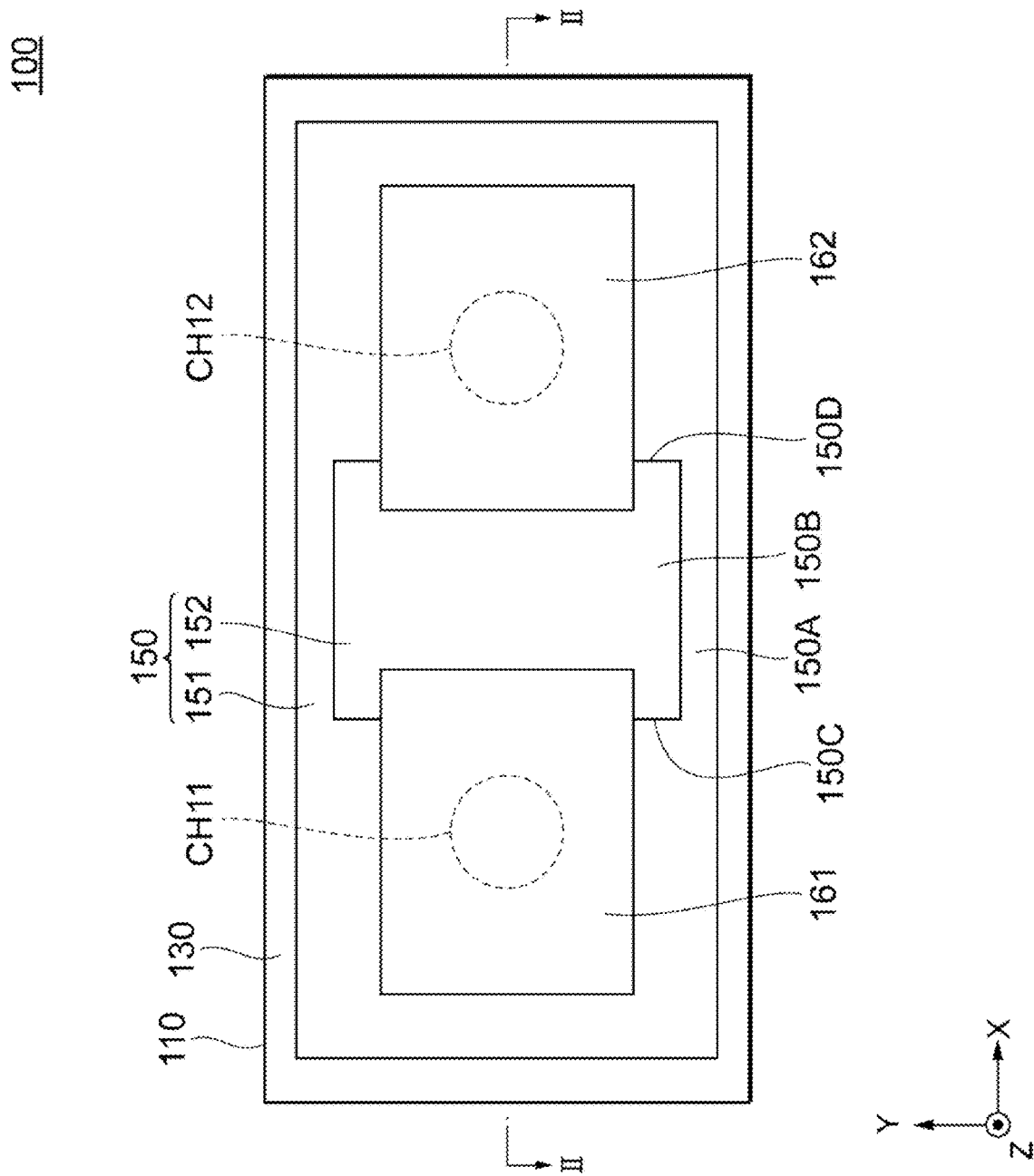
FIG. 1 is a plan view schematically showing a configuration of a thin film capacitor according to a first embodiment.
Figure 2:
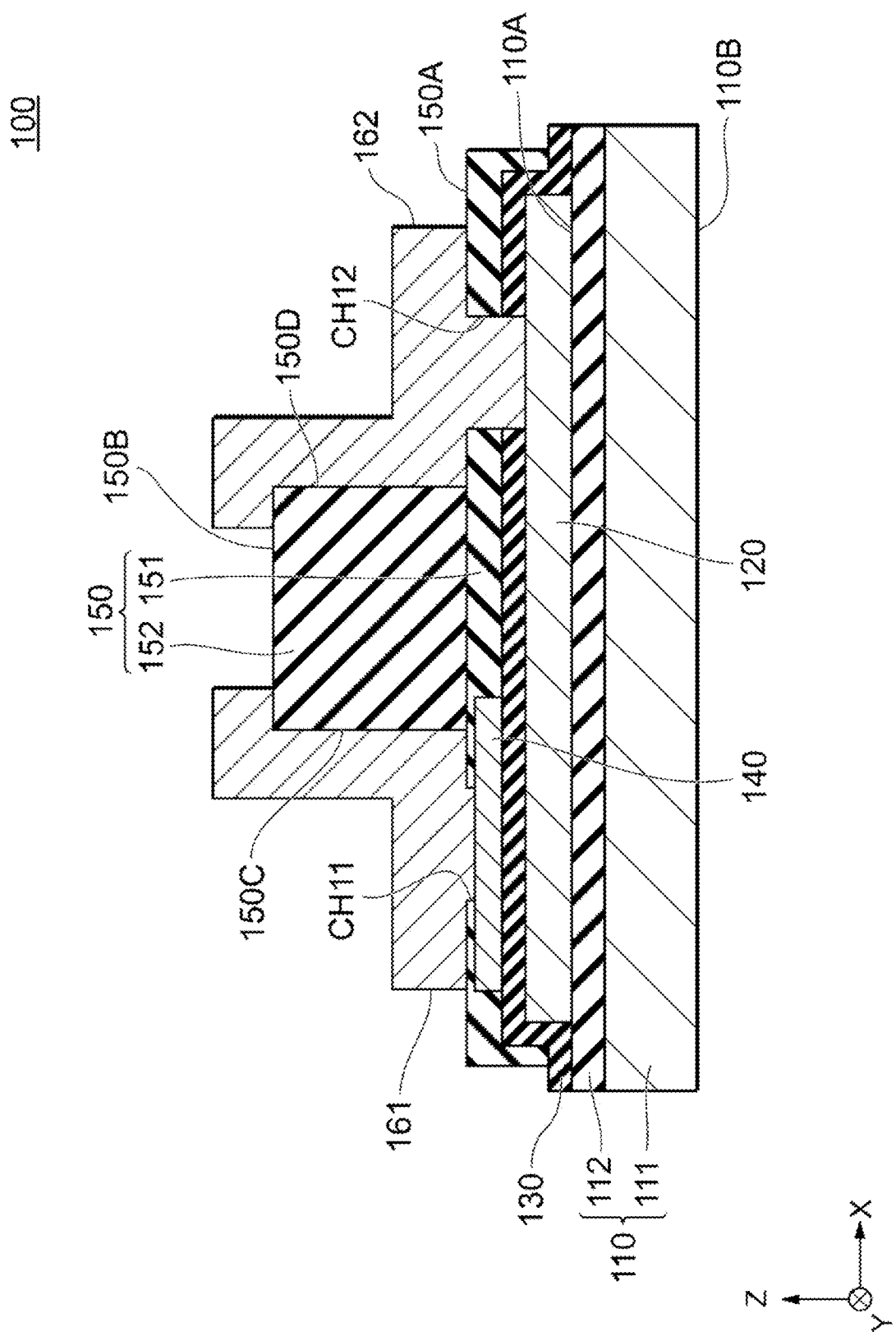
FIG. 2 is a cross-sectional view schematically showing a cross-sectional configuration taken along the line II-II of the thin film capacitor shown in FIG. 1.

First, the configuration of a thin film capacitor 100 according to the first embodiment of the present invention will be described with reference to FIG. 1 and FIG. 2. FIG. 1 is a plan view schematically showing the configuration of the thin film capacitor according to the first embodiment. FIG. 2 is a cross-sectional view schematically showing a cross-sectional configuration taken along the line II-II of the thin film capacitor shown in FIG. 1.

The thin film capacitor 100 includes a substrate 110, a lower electrode 120, a dielectric film 130, an upper electrode 140, a stepped protective film 150, a first terminal electrode 161, and a second terminal electrode 162.

The substrate 110 has a first main surface 110A and a second main surface 110B parallel to the XY plane. The first main surface 110A is a main surface on the Z-axis positive direction side, and the second main surface 110B is a main surface on the Z-axis negative direction side. When viewed from the normal direction of the first main surface 110A, the substrate 110 has a rectangular shape. However, the shape of the substrate 110 is not limited to the above, and may be a polygonal shape, a circular shape, an elliptical shape, or a combination thereof.

The substrate 110 has a two-layer structure including a semiconductor substrate 111 on the second main surface 110B side and an insulating layer 112 on the first main surface 110A side. For example, the semiconductor substrate 111 is a low-resistance silicon substrate, and the insulating layer 112 is a silicon oxide ($SiO_2$) film. By forming the thin film capacitor 100 on the semiconductor substrate 111, another semiconductor element can be formed on the same substrate, and an integrated circuit including the thin film capacitor 100 can be formed. The insulating layer 112 suppresses the generation of parasitic capacitance and leakage current. The semiconductor substrate 111 is not limited to a silicon substrate, and may be a substrate formed of a compound semiconductor such as a gallium arsenide substrate. The insulating layer 112 is not limited to the $SiO_2$ film as long as the insulating property is higher than that of the semiconductor substrate 111, but may be a silicon nitride (SiN) film, a silicon oxynitride (SiON) film, an alumina ($Al_2O_3$) film, or the like. The substrate 110 may be a single-layer insulating substrate or a substrate having a multilayer structure of three or more layers.

The lower electrode 120 is provided on the first main surface 110A of the substrate 110. The lower electrode 120 is formed in an island shape, and is located inside the substrate 110 when viewed from the normal direction of the first main surface 110A of the substrate 110 (i.e., a plan view). The lower electrode 120 is, for example, metal such as Cu (copper), Ag (silver), Au (gold), Al (aluminum), Mo (molybdenum), W (tungsten), Pt (platinum), Ti (titanium), Ni (nickel), Cr (chromium), or the like, or an alloy thereof. The constituent material of the lower electrode 120 is not limited to the above, and may be a metal oxide such as $RuO_2$, $SrRuO_3$, $LaNiO_3$, or the like as long as it has conductivity, or may be an organic material such as a conductive resin. The lower electrode 120 may have a multilayer structure.

The dielectric film 130 covers the lower electrode 120. That is, the dielectric film 130 is provided on the lower electrode 120 and is adjacent to the end surface of the lower electrode 120. The dielectric film 130 has an insulating property, and is made of, for example, a silicon compound or a metal oxide. As the silicon compound, there can be given, for example, $SiO_2$, SiN, and SiNO. As the metal oxide, there can be given, for example, $Al_2O_3$, hafnium oxide ($HfO_2$), tantalum oxide ($Ta_2O_5$), barium titanate ($BaTiO_3$), barium strontium titanate (($BaSr)TiO_3$), strontium titanate ($SrTiO_3$), and calcium zirconate ($CaZrO_3$). From the viewpoint of increasing the capacitance of the thin film capacitor 100, the dielectric film 130 is desirably provided by a material having a high dielectric constant, for example, by a perovskite oxide having a dielectric constant higher than that of $SiO_2$. The dielectric film 130 may have a multilayer structure.

The upper electrode 140 is provided on the dielectric film 130. The upper electrode 140 faces the lower electrode 120 across the dielectric film 130 in the Z-axis direction. The upper electrode 140 is made of, for example, a conductive material appropriately selected from the metals, metal oxides, and organic materials mentioned as the constituent material of the lower electrode 120.

The stepped protective film 150 has a step shape and includes a first protective film 151 and a second protective film 152. The first protective film 151 corresponds to the lower stage of the stepped protective film 150, and the second protective film 152 corresponds to the upper stage of the stepped protective film 150. In other words, the second protective film 152 forms a step in the stepped protective film 150. The first protective film 151 and the second protective film 152 are preferably formed separately. That is, the first protective film 151 and the second protective film 152 are sequentially formed by different processes. At this time, for example, a boundary plane is formed between the first protective film 151 and the second protective film 152. When formed separately, the processing accuracy for determining the positions and dimensions of the first through hole and the second through hole, the positions of the first upper surface and the second upper surface, and the like can be improved. However, the first protective film 151 and the second protective film 152 may be formed integrally. That is, the first protective film 151 and the second protective film 152 may be collectively formed by the same process.

The first protective film 151 is provided on the dielectric film 130 and the upper electrode 140, and has a first upper surface 150A on the side opposite to the dielectric film 130 side. In the first protective film 151, a first through hole CH11 and a second through hole CH12 having an opening end on the first upper surface 150A and penetrating the first protective film 151 along the Z-axis direction are formed. The first through hole CH11 opens to the upper electrode 140, and the second through hole CH12 opens to the lower electrode 120. The first through hole CH11 and the second through hole CH12 are aligned in the X-axis direction, and the first through hole CH11 is located on the X-axis negative direction side of the second through hole CH12. Note that the second through hole CH12 penetrates not only the first protective film 151 but also the dielectric film 130.

For example, the second through hole CH12 has an inner side surface extending in the Z-axis direction that integrally penetrates the first protective film 151 and the dielectric film 130. Alternatively, the second through hole CH12 does not need to penetrate the first protective film 151 and the dielectric film 130 integrally, but may have a step at the boundary between the dielectric film 130 and the first protective film 151 so that the diameter may change discontinuously.

The second protective film 152 is provided on the first upper surface 150A of the first protective film 151. Further, the second protective film 152 extends in the Y-axis direction so as to include a region between the first through hole CH11 and the second through hole CH12. The thickness of the second protective film 152 is more than the thickness of the first protective film 151. The second protective film 152 has a second upper surface 150B on the side opposite to the dielectric film 130 side. Further, the second protective film 152 has side surfaces 150C and 150D. The side surfaces 150C and 150D correspond to end surfaces extending in the Y-axis direction among end surfaces connecting the first upper surface 150A and the second upper surface 150B. The side surfaces 150C and 150D face each other in the X-axis direction. The side surface 150C is located on the first through hole CH11 side, and the side surface 150D is located on the second through hole CH12 side.

The first protective film 151 and the second protective film 152 are each made of an insulating material. Such an insulating material is not particularly limited, but from the viewpoint of absorbing impact and suppressing damage to the thin film capacitor 100, is desirably a resin material such as polyimide resin, epoxy resin, phenol resin, benzocyclobutene resin, polyamide resin, or fluorine resin. Further, from the viewpoint of suppressing deterioration of the lower electrode 120, the dielectric film 130, and the upper electrode 140, the insulating material desirably has a high gas barrier property against hydrogen ($H_2$), water vapor ($H_2O$), or the like, and polyamide resin is preferably used. The first protective film 151 and the second protective film 152 are made of the same material, for example. However, the first protective film 151 and the second protective film 152 may be provided by different materials. Each of the first protective film 151 and the second protective film 152 may have a multilayer structure. For example, the first protective film 151 may have a layer with high moisture resistance such as SiN on the dielectric film 130 and the upper electrode 140 side.

The first terminal electrode 161 is an electrode for electrically connecting the upper electrode 140 and an external power source and applying a voltage to the upper electrode 140. The first terminal electrode 161 is electrically connected to the upper electrode 140 through the first through hole CH11. The first terminal electrode 161 extends on the first upper surface 150A, the side surface 150C, and the second upper surface 150B. Similarly, the second terminal electrode 162 is an electrode for applying a voltage to the lower electrode 120, and is electrically connected to the lower electrode 120 through the second through hole CH12. The second terminal electrode 162 extends on the first upper surface 150A, the side surface 150D, and the second upper surface 150B. The material constituting the first terminal electrode 161 and the second terminal electrode 162 is not particularly limited as long as it is a conductive material, but it is desirably made of a metal material having good conductivity such as Cu, Ag, Au, Al, or the like. In addition, the first terminal electrode 161 and the second terminal electrode 162 may have a multilayer structure. The first terminal electrode 161 and the second terminal electrode 162 having a multilayer structure desirably have a surface layer with good chemical stability such as corrosion resistance and oxidation resistance, and in particular, desirably have a metal layer containing Au on the surface.

According to the above embodiment, without increasing the areas of the first terminal electrode and the second terminal electrode when viewed from the normal direction of the first upper surface of the first protective film, the surface areas of the first terminal electrode and the second terminal electrode can be increased. For this reason, a thin film capacitor with improved close contact properties with solder without an increase in size. That is, the mountability of the thin film capacitor can be improved. Moreover, the terminal electrode extends on the side surface of the protective film, so that the solder can form a fillet shape. For this reason, disturbance of the mounting posture of the thin film capacitor can be suppressed, and contact with other elements and wirings can be suppressed. From the above, it is possible to suppress the deterioration of the performance of the thin film capacitor due to the drop of the thin film capacitor upon impact such as a drop or interference with other elements. That is, the reliability of the thin film capacitor can be improved.

Figure 3:
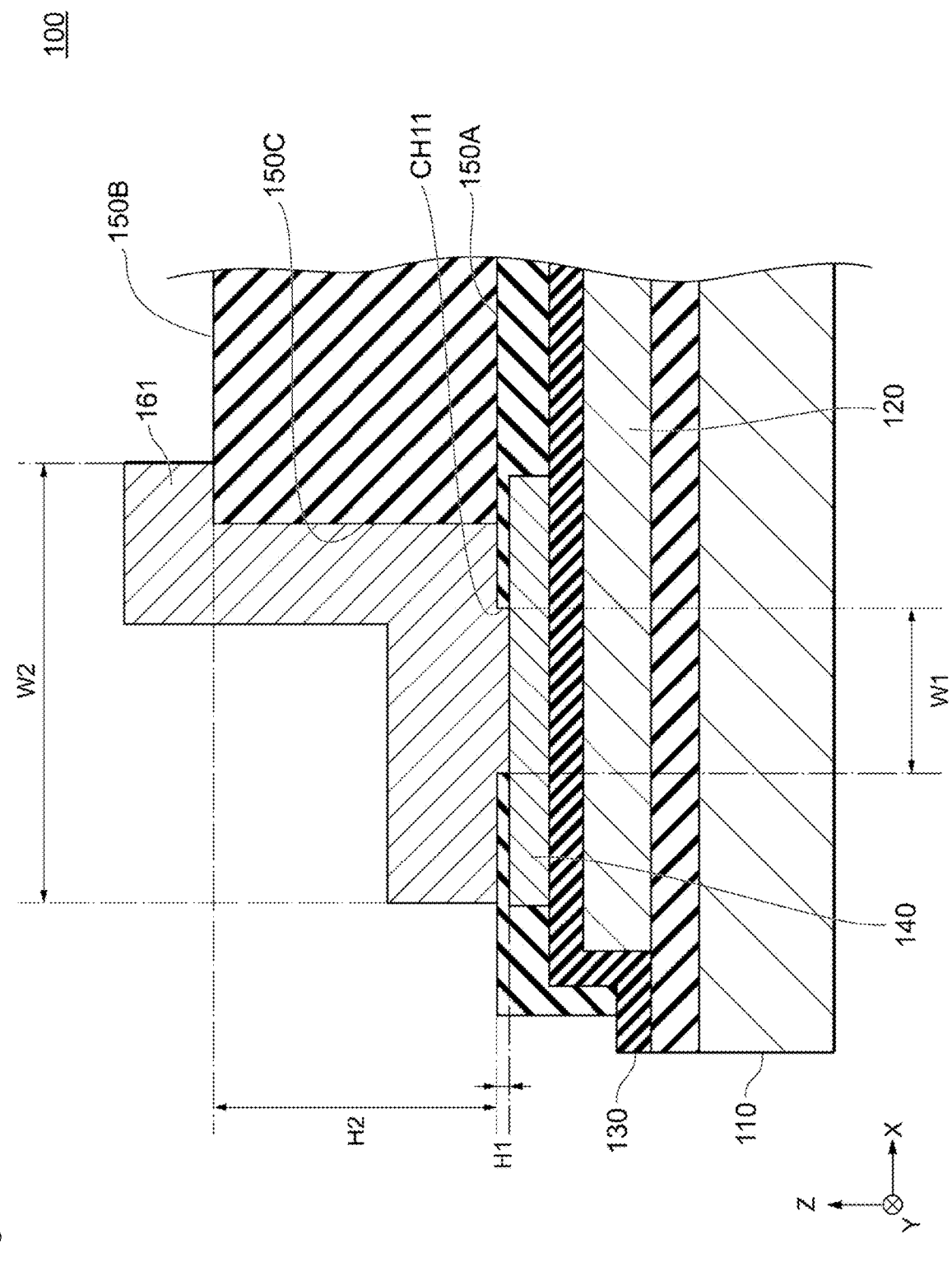
FIG. 3 is an enlarged cross-sectional view centering on a first terminal electrode of the thin film capacitor shown in FIG. 2.

Next, the dimensions of the stepped protective film 150, the first terminal electrode 161, and the second terminal electrode 162 will be described with reference to FIG. 3. FIG. 3 is an enlarged cross-sectional view centering on the first terminal electrode of the thin film capacitor shown in FIG. 2. Note that the description will be made by paying attention to the dimensions of the first terminal electrode 161 based on FIG. 3, but the dimensions of the second terminal electrode 162 are the same as the dimensions of the first terminal electrode 161, and thus the description thereof is omitted.

The height H2 along the Z-axis direction of the side surface 150C is more than the height H1 along the Z-axis direction of the first through hole CH11 (H1<H2). The height H2 is desirably 2 times to 20 times of the height H1 (2≤H2/H1≤20). According to this, an increase in the height of the thin film capacitor 100 can be suppressed while increasing the surface area of the first terminal electrode 161, and close contact between the solder and the terminal electrode can be improved. Specifically, if the height H2 is less than 2 times the height H1, the surface area of the first terminal electrode 161 cannot be sufficiently increased, and the effect of improving the mountability of the thin film capacitor 100 is reduced. If the height H2 is more than 20 times the height H1, the thin film capacitor 100 becomes too tall and the thin film capacitor 100 becomes structurally unstable. As an example, the stepped protective film 150 is formed so that the height H1 is 3 μm to 5 μm and the height H2 is 10 μm to 100 μm. The height H1 corresponds to the thickness of the first protective film 151, and the height H2 corresponds to the thickness of the second protective film 152. Further, the height H2 corresponds to the height of the portion along the side surface 150C of the first terminal electrode 161.

The width W1 along the X-axis direction of the first through hole CH11 is less than the width W2 along the X-axis direction of the first terminal electrode 161 (W1<W2). The width W1 is more than the height H1 (H1<W1). According to this, it is possible to suppress the occurrence of short circuit or leakage current between the terminal electrodes due to the reduction in the width of the second protective film 152 while increasing the contact area between the first terminal electrode 161 and the upper electrode 140. The height H2 is desirably 0.2 times to 2 times of the width W2 (0.2≤H2/W2≤2). According to this, an increase in the height of the thin film capacitor 100 can be suppressed while increasing the surface area of the first terminal electrode 161. Specifically, if the height H2 is less than 0.2 times the width W2, the surface area of the first terminal electrode 161 cannot be sufficiently increased, and the effect of improving the mountability of the thin film capacitor 100 is reduced. If the height H2 is more than 2 times the width W2, the thin film capacitor 100 becomes too tall and the thin film capacitor 100 becomes structurally unstable.

Figure 4:
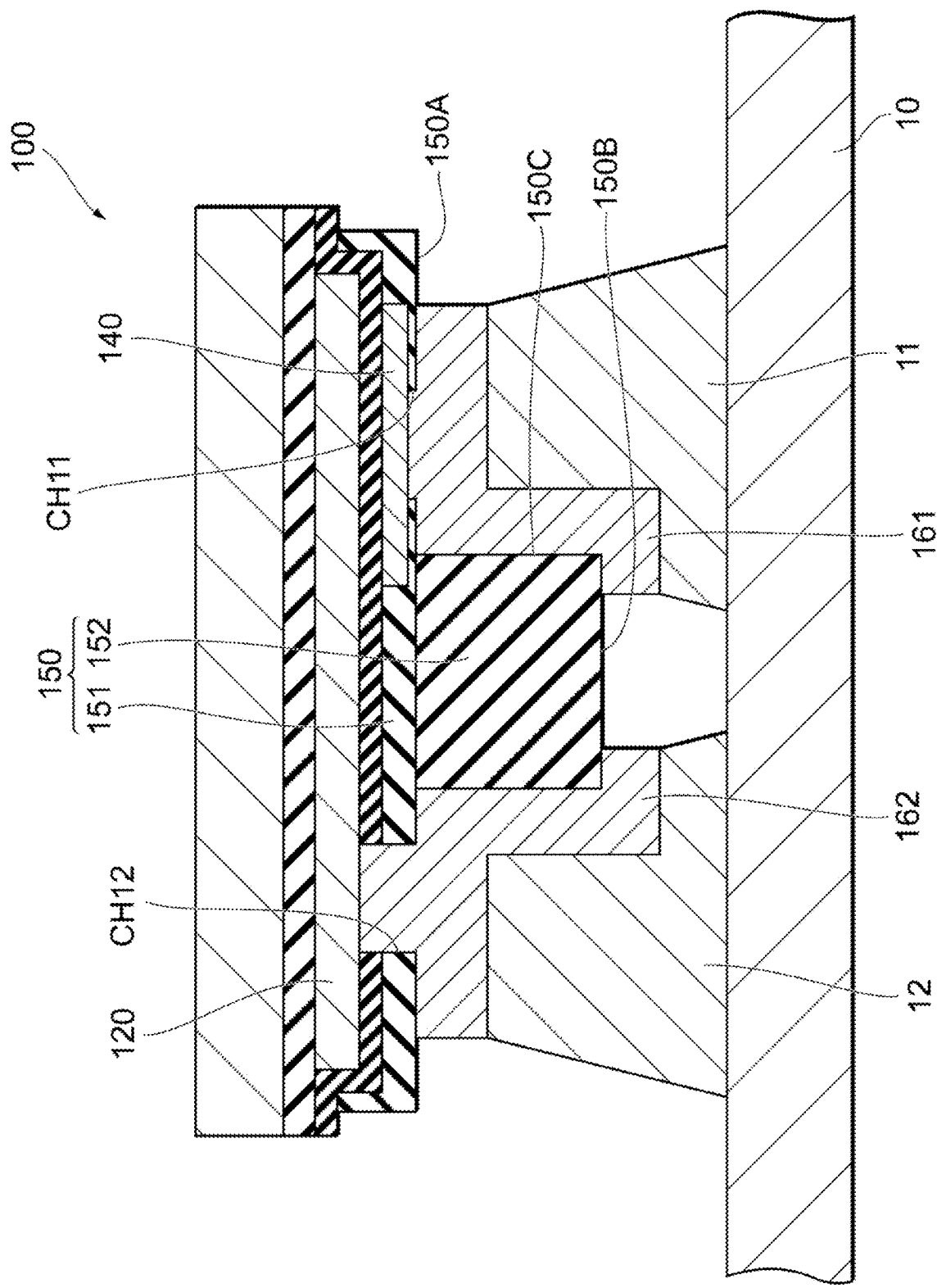
FIG. 4 is a cross-sectional view schematically showing a mounting mode of the thin film capacitor to an external substrate according to the first embodiment.

Next, a mounting mode of the thin film capacitor 100 will be described with reference to FIG. 4. FIG. 4 is a cross-sectional view schematically showing the mounting mode of the thin film capacitor to an external substrate according to the first embodiment.

The thin film capacitor 100 is mounted on the external substrate 10 with solder 11 and solder 12. The solder 11 electrically connects the first terminal electrode 161 and the external substrate 10, and the solder 12 electrically connects the second terminal electrode 162 and the external substrate 10. Since the surface area of the first terminal electrode 161 is increased by the first terminal electrode 161 extending along the side surface 150C, the close contact between the first terminal electrode 161 and the solder 11 is improved. Further, the first terminal electrode 161 extends on the side surface 150C, so that the solder 11 can form a fillet shape. Similarly, the second terminal electrode 162 can also improve the close contact with the solder 12, and the solder 12 can be formed in a fillet shape. By improving the close contact between the solder 11 and the solder 12, the mountability of the thin film capacitor 100 is improved. Further, since the solder 11 and the solder 12 are formed in a fillet shape, disturbance of the posture of the thin film capacitor 100 can be suppressed, and contact with other elements and wirings can be suppressed.

According to this, the solder that contacts the first terminal electrode and the solder that contacts the second terminal electrode are separated by the second protective film formed between the first terminal electrode and the second terminal electrode. For this reason, it is possible to suppress short circuit between the solder that contacts the first terminal electrode and the solder that contacts the second terminal electrode.

Figure 5:
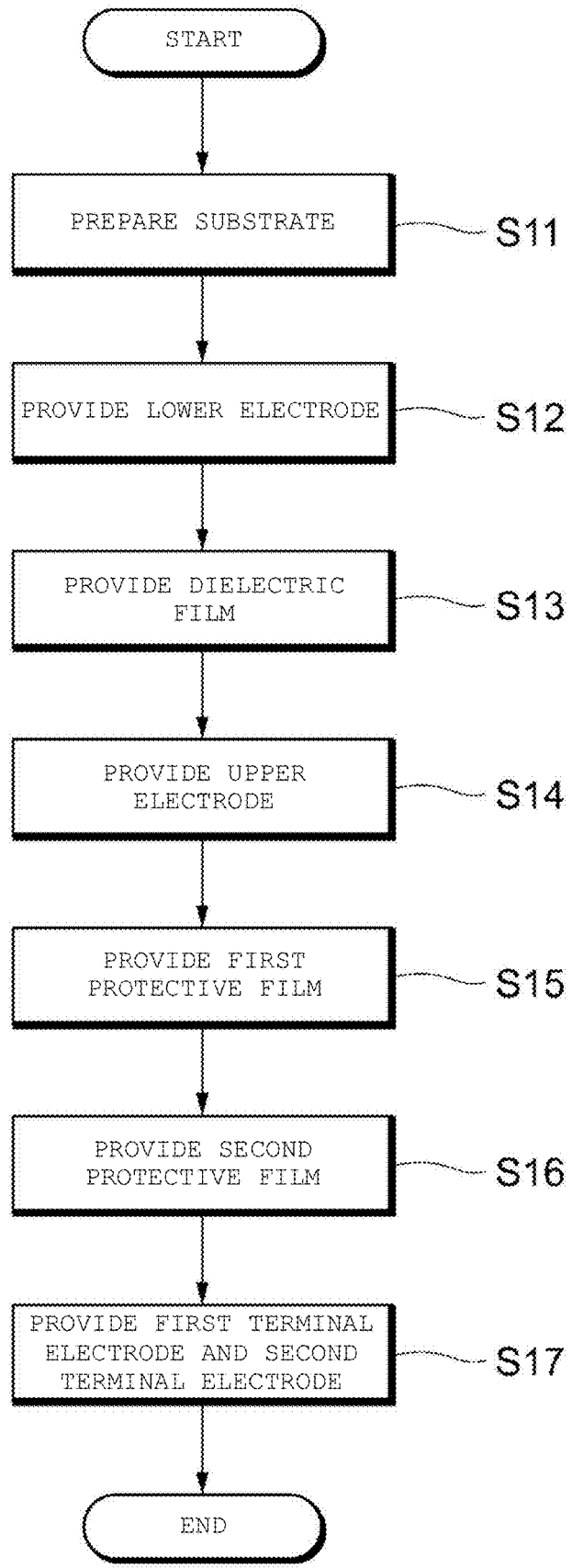
FIG. 5 is a flowchart schematically showing a method of manufacturing a thin film capacitor according to the first embodiment.
Figure 6:
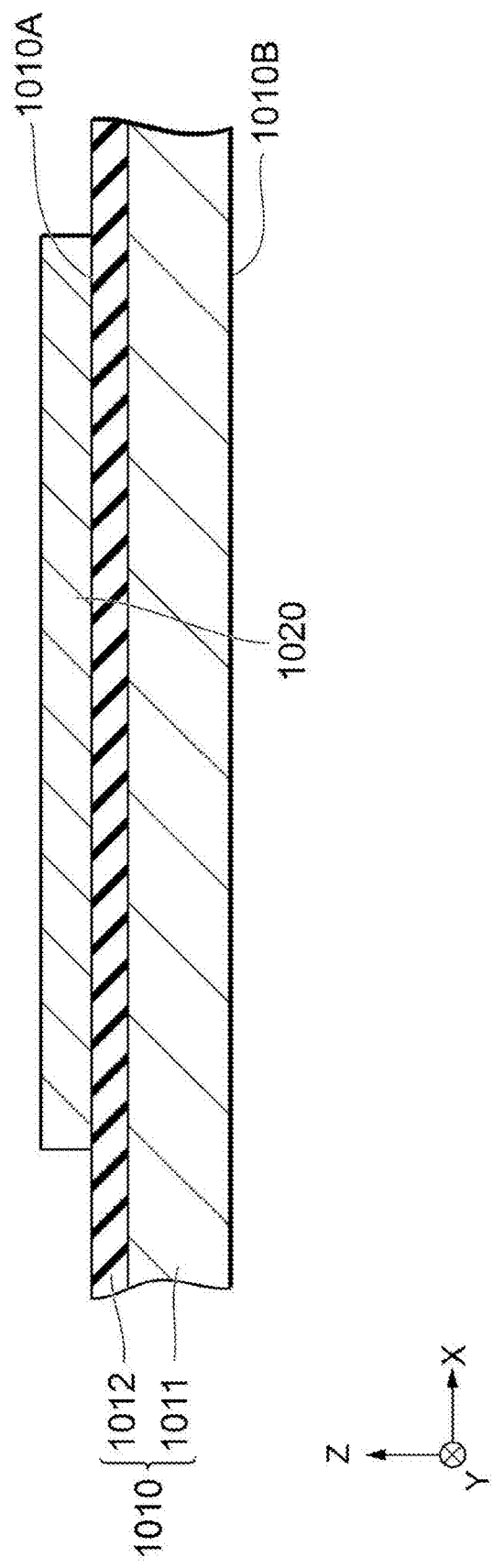
FIG. 6 is a cross-sectional view schematically showing a step of providing a lower electrode on a substrate.
Figure 7:
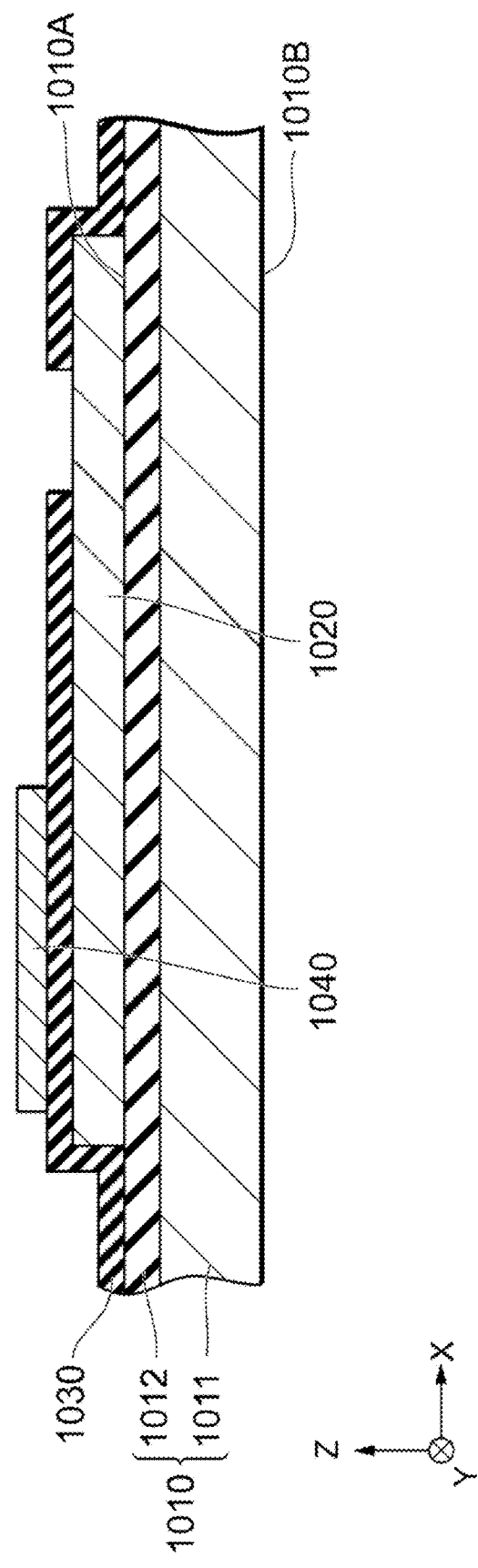
FIG. 7 is a cross-sectional view schematically showing a step of providing an upper electrode on a dielectric film.
Figure 8:
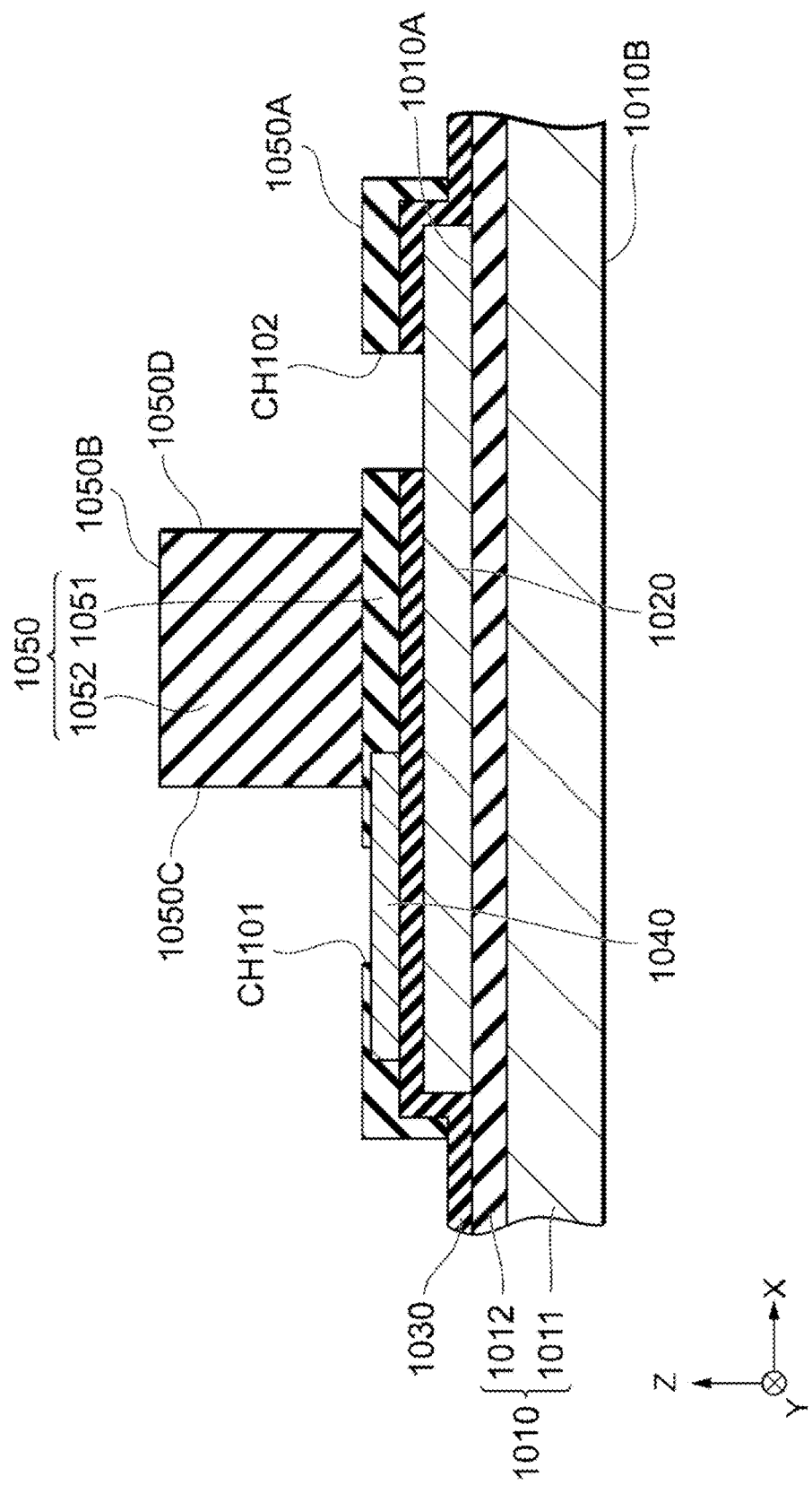
FIG. 8 is a cross-sectional view schematically showing a step of providing a first protective film and a second protective film.
Figure 9:
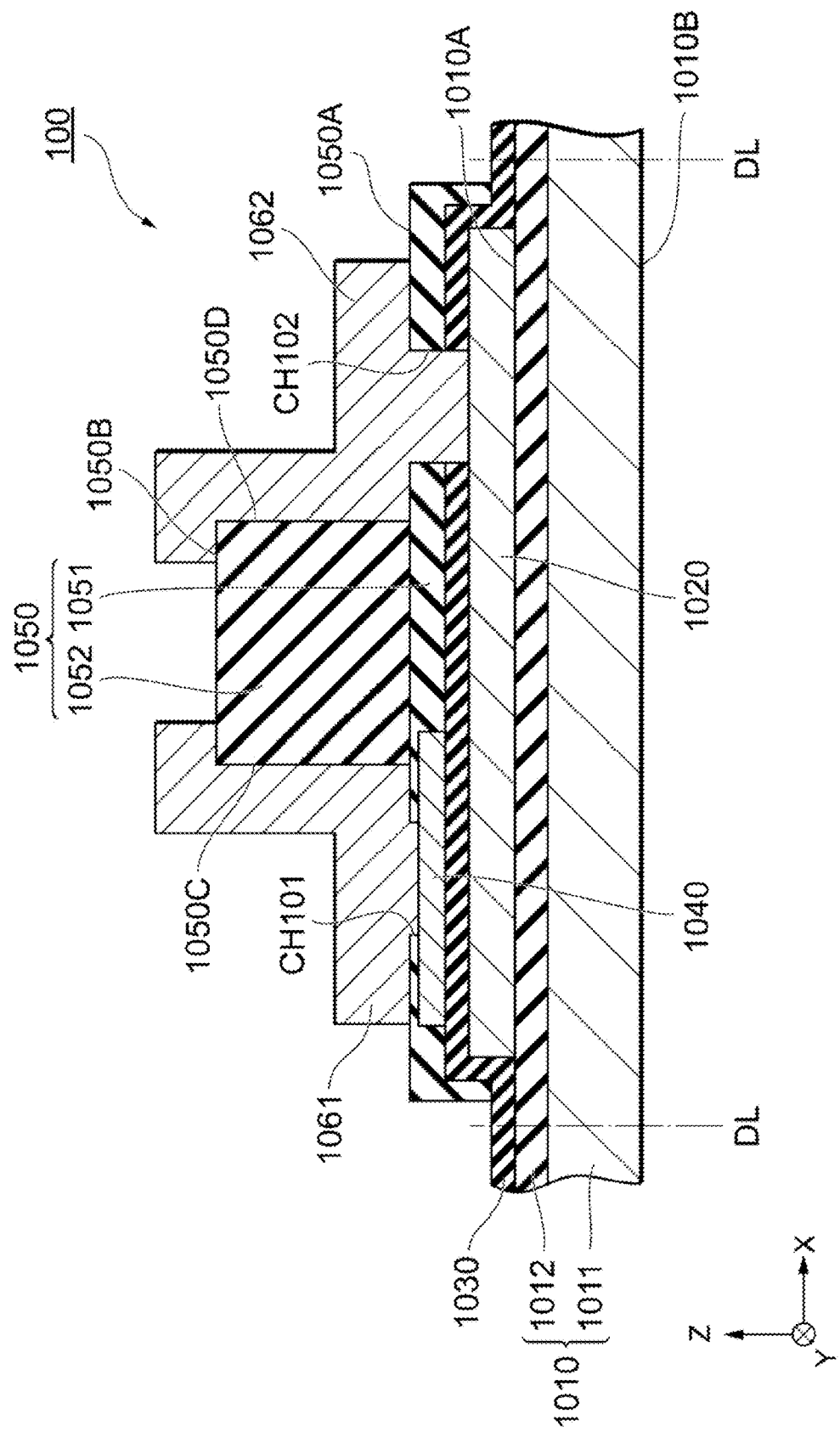
FIG. 9 is a cross-sectional view schematically showing a step of providing a first terminal electrode and a second terminal electrode.

Next, a method of manufacturing the thin film capacitor 100 will be described with reference to FIG. 5 to FIG. 9. FIG. 5 is a flowchart schematically showing the method of manufacturing the thin film capacitor according to the first embodiment. FIG. 6 is a cross-sectional view schematically showing a step of providing a lower electrode on a substrate. FIG. 7 is a cross-sectional view schematically showing a step of providing an upper electrode on a dielectric film. FIG. 8 is a cross-sectional view schematically showing a step of providing the first protective film and the second protective film. FIG. 9 is a cross-sectional view schematically showing a step of providing the first terminal electrode and the second terminal electrode.

First, a substrate 1010 is prepared (S11). At this time, a flat semiconductor substrate 1011 is first prepared. The semiconductor substrate 1011 is formed by slicing a silicon single crystal ingot to obtain a silicon wafer and smoothing the surface of the silicon wafer by polishing. Next, a first main surface 1010A side of the semiconductor substrate 1011 is thermally oxidized to form an insulating layer 1012 made of a SiO$_2$ film as a surface oxide film.

Next, a lower electrode 1020 is provided (S12). As shown in FIG. 6, a lower electrode 1020 is provided on the first main surface 1010A side of the substrate 1010, that is, on the insulating layer 1012 side. In patterning of the lower electrode 1020, etching using a photolithography method is performed. That is, first, a metal layer is formed on the entire surface of the first main surface 1010A side of the substrate 1010. Next, a resin layer patterned by a photolithography method is provided on the metal layer. Next, after the metal layer is etched using the resin layer as a mask, the resin layer is removed and washed. The patterning of the lower electrode 1020 is not limited to etching, but may be a so-called lift-off method in which a metal layer is provided on the patterned resin layer and a part of the metal layer is removed together with the resin layer. Alternatively, the lower electrode 1020 may be provided by a plating method using the patterned conductive layer as a base layer.

Next, a dielectric film 1030 is provided (S13). As shown in FIG. 7, the dielectric film 1030 is provided on the substrate 1010 and the lower electrode 1020 so as to cover the lower electrode 1020. The dielectric film 1030 is provided by depositing a dielectric by a CVD (Chemical Vapor Deposition) method or a PVD (Physical Vapor Deposition) method. According to this, a dense dielectric film 1030 can be formed, and malfunction of the thin film capacitor 100 due to short circuit between the lower electrode 1020 and the upper electrode 1040, electric field concentration on defects, and the like can be suppressed. Note that the method of forming the dielectric film 1030 is not limited to the above, and the dielectric film 1030 may be provided by a wet process such as a spin coating method or various printing methods such as gravure.

Next, the upper electrode 1040 is provided (S14). The upper electrode 1040 can be patterned by the same method as the lower electrode 1020. After the upper electrode 1040 is patterned, as shown in FIG. 7, a part of the dielectric film 1030 is removed so that a part of the lower electrode 1020 is exposed. The removed portion of the dielectric film 1030 corresponds to a part of a second through hole CH102 for a second terminal electrode 1062 described later to contact the lower electrode 1020.

Next, a first protective film 1051 is provided (S15). As shown in FIG. 8, the first protective film 1051 is obtained by depositing photosensitive resin such as photosensitive polyimide on the dielectric film 1030 and the upper electrode 1040, and patterning it by a photolithography method. That is, the first protective film 1051 is a portion remaining as a result of dissolving and removing the exposed or unexposed portion of the exposed photosensitive resin with developer. At this time, a first through hole CH101 and the second through hole CH102 are formed together with the outer shape of the first protective film 1051 by patterning. The patterning of the first protective film 1051 is not limited to the above, and the first protective film 1051 may be patterned by, for example, partially removing a resin layer to be the first protective film 1051 by etching using a photoresist patterned by a photolithography method as a mask.

Next, a second protective film 1052 is provided (S16). As shown in FIG. 8, the second protective film 1052 is also patterned by a photolithography method by depositing photosensitive resin on the first protective film 1051 in the same manner as the first protective film 1051. Note that the order of film formation and patterning of the first protective film 1051 and the second protective film 1052 is not limited to the above. For example, the second protective film 1052 may be formed after the first protective film 1051 is formed, and then the patterning of the second protective film 1052 and the patterning of the first protective film 1051 may be sequentially performed. Further, the patterning of the first protective film 1051 and the second protective film 1052 may be collectively performed by multi-tone exposure using a halftone mask, a gray tone mask, or the like.

Next, a first terminal electrode 1061 and a second terminal electrode 1062 are provided (S17). As shown in FIG. 9, the first terminal electrode 1061 is patterned so as to extend in the first through hole CH101 of the stepped protective film 1050 and on a first upper surface 1050A, a side surface 1050C, and a second upper surface 1050B. The second terminal electrode 1062 is similarly patterned. The first terminal electrode 1061 and the second terminal electrode 1062 can be patterned by the same method as the lower electrode 1020 and the upper electrode 1040.

Finally, the substrate 1010 and the dielectric film 1030 are cut along the dicing line DL to divide the thin film capacitor 100 into individual pieces. There is no particular limitation on the method for individual piece division, and individual piece division can be performed by cut by blade dicing, cut by stealth dicing, dry etching, or the like.

Other embodiments will be described below. In each of the following embodiments, the description of matters common to the first embodiment described above will be omitted, and only different points will be described. The configuration with the same name as the first embodiment has the same functions and effects as the configuration in the first embodiment, and detailed description thereof is omitted.

Second Embodiment

Figure 10:
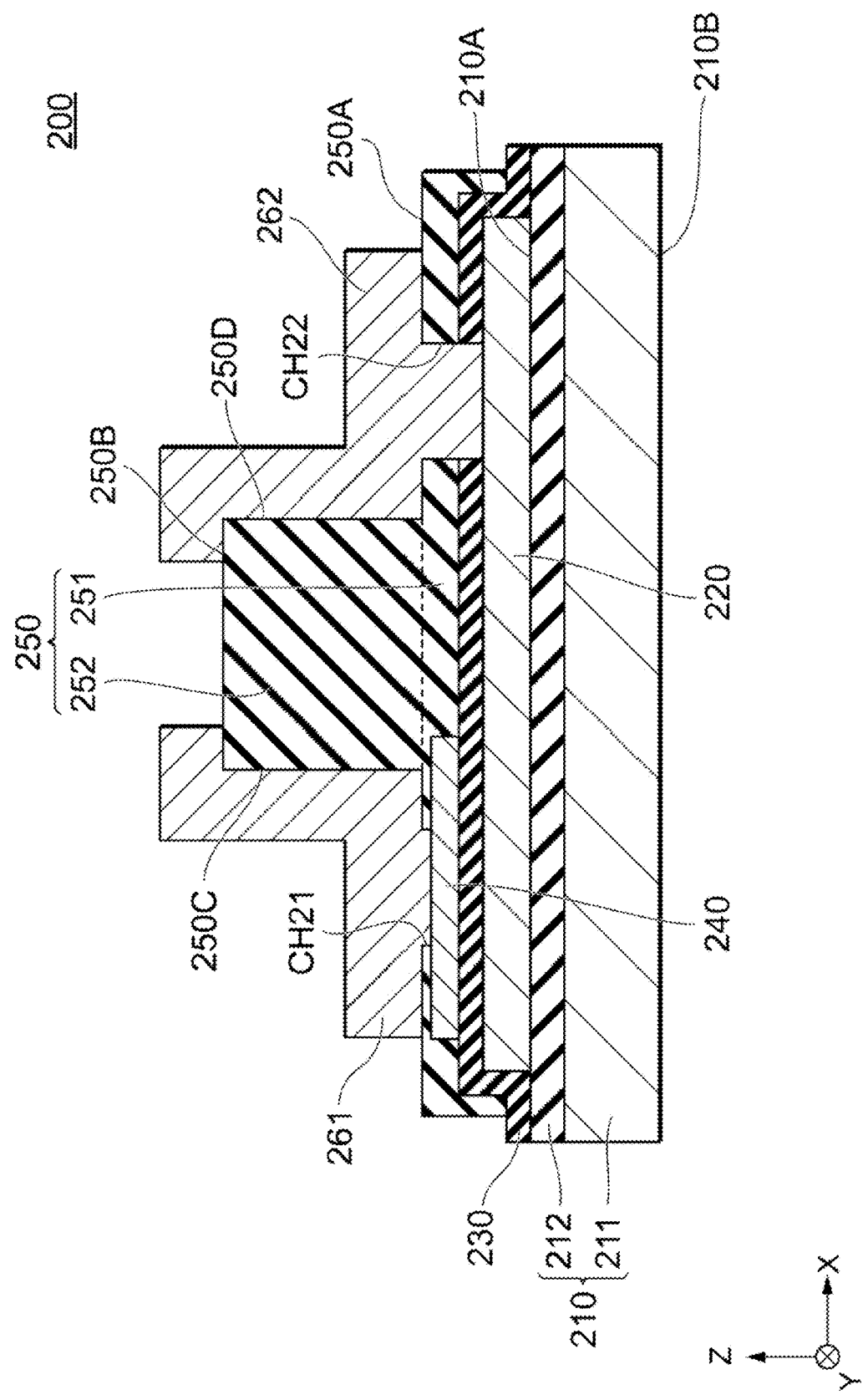
FIG. 10 is a cross-sectional view schematically showing a configuration of a thin film capacitor according to a second embodiment.

The configuration of a thin film capacitor 200 according to the second embodiment will be described with reference to FIG. 10. FIG. 10 is a cross-sectional view schematically showing the configuration of a thin film capacitor according to the second embodiment. The thin film capacitor 200 includes a substrate 210 formed of a semiconductor substrate 211 and an insulating layer 212, a lower electrode 220, a dielectric film 230, an upper electrode 240, a stepped protective film 250 including a first protective film 251 and a second protective film 252, a first terminal electrode 261, and a second terminal electrode 262. The substrate 210 has a first main surface 210A and a second main surface 210B. The stepped protective film 250 has a first upper surface 250A, a second upper surface 250B, and side surfaces 250C and 250D, and has a first through hole CH21 and a second through hole CH22 formed therein.

The thin film capacitor 200 according to the second embodiment is different from the thin film capacitor 100 according to the first embodiment in that the stepped protective film 250 is formed integrally. In the stepped protective film 250, the first protective film 251 and the second protective film 252 are formed by one continuous member. In such a configuration, the manufacturing process can be simplified and the manufacturing cost can be reduced. Further, since damage at the boundary between the first protective film 251 and the second protective film 252 can be suppressed, the mechanical strength of the stepped protective film 250 is improved.

Third Embodiment

Figure 11:
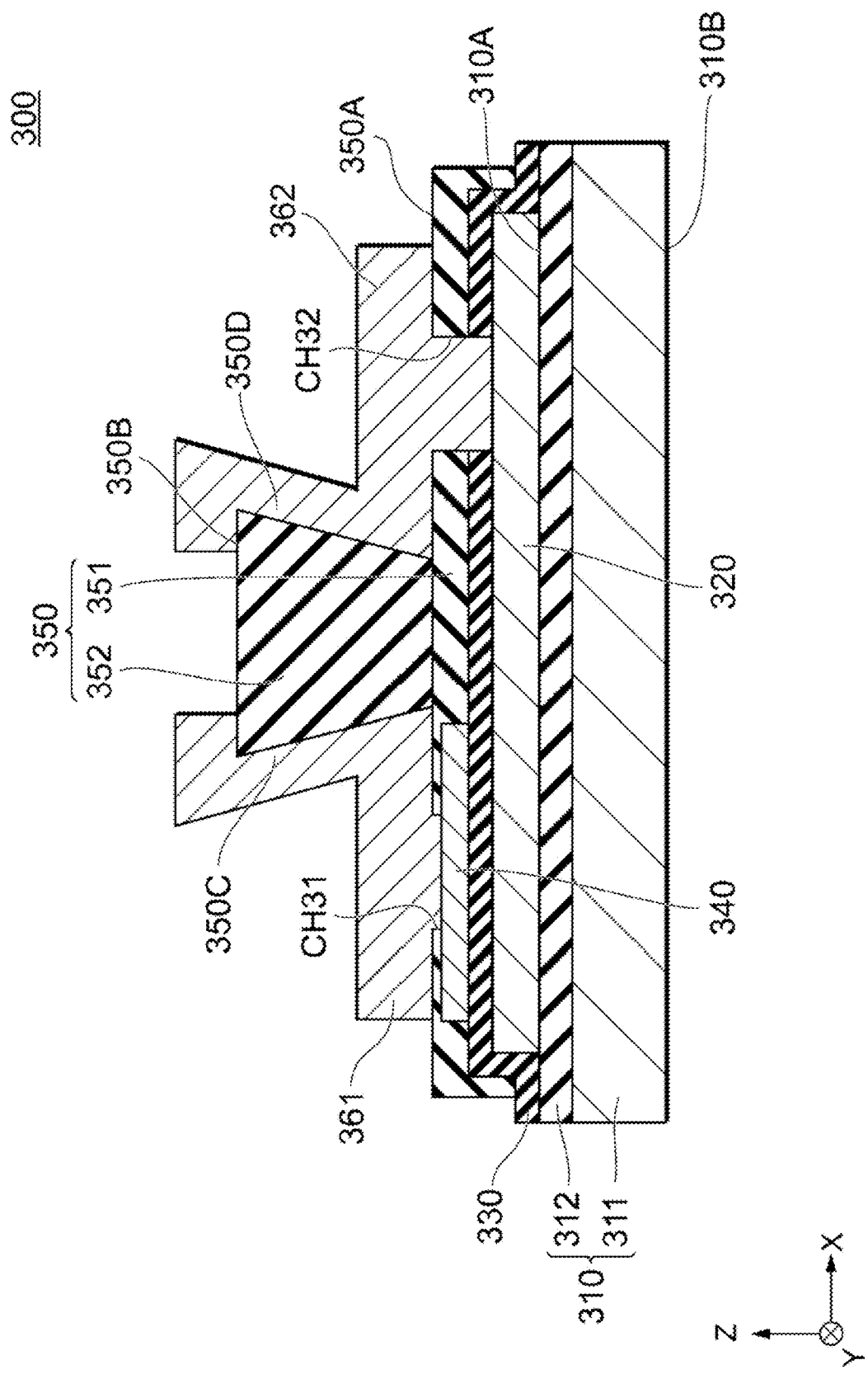
FIG. 11 is a cross-sectional view schematically showing a configuration of a thin film capacitor according to a third embodiment.

The configuration of a thin film capacitor 300 according to the third embodiment will be described with reference to FIG. 11. FIG. 11 is a cross-sectional view schematically showing the configuration of a thin film capacitor according to the third embodiment. The thin film capacitor 300 includes a substrate 310 formed of a semiconductor substrate 311 and an insulating layer 312, a lower electrode 320, a dielectric film 330, an upper electrode 340, a stepped protective film 350 including a first protective film 351 and a second protective film 352, a first terminal electrode 361, and a second terminal electrode 362. The substrate 310 has a first main surface 310A and a second main surface 310B. The stepped protective film 350 has a first upper surface 350A, a second upper surface 350B, and side surfaces 350C and 350D, and has a first through hole CH31 and a second through hole CH32 formed therein.

The thin film capacitor 300 according to the third embodiment is different from the thin film capacitor 100 according to the first embodiment in that the cross-sectional shape of the second protective film 352 is a reverse tapered shape. That is, the second protective film 352 has side surfaces 350C and 350D having a reverse tapered shape from the first upper surface 350A to the second upper surface 350B. In other words, the first upper surface 350A and the side surface 350C of the stepped protective film 350 form an acute angle on the first terminal electrode 361 side. Similarly, the first upper surface 350A and the side surface 350D also form an acute angle on the second terminal electrode 362 side. According to this, without increasing the areas of each of the first terminal electrode 361 and the second terminal electrode 362 when viewed from the normal direction of the second upper surface 350B of the stepped protective film 350, the surface area of each of the first terminal electrode 361 and the second terminal electrodes 362 can be increased. In addition, it is difficult for the solder to peel due to the anchor effect, and the bonding strength of the thin film capacitor 300 to the external substrate can be improved.

Fourth Embodiment

Figure 12:
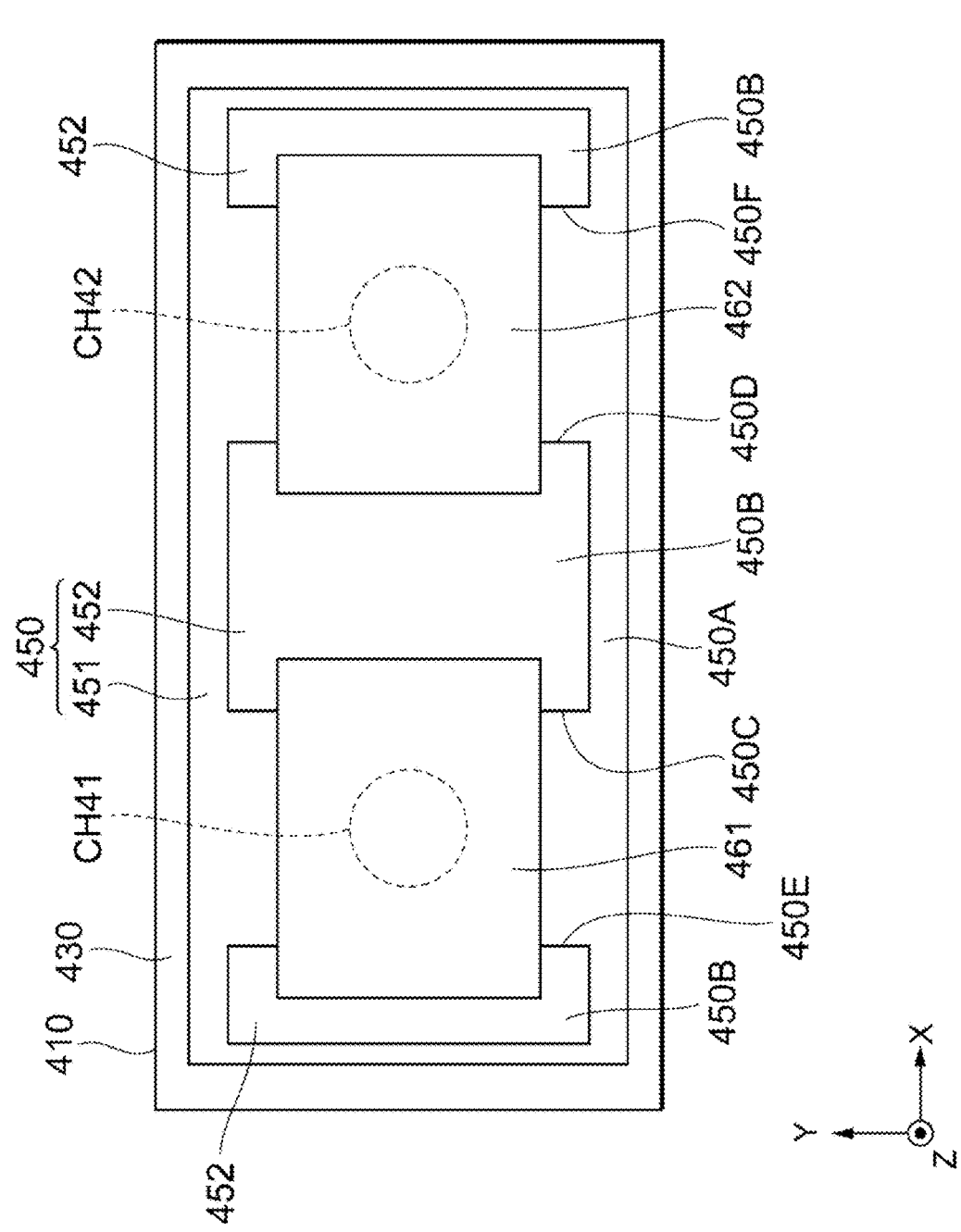
FIG. 12 is a plan view schematically showing a configuration of a thin film capacitor according to a fourth embodiment.
Figure 13:
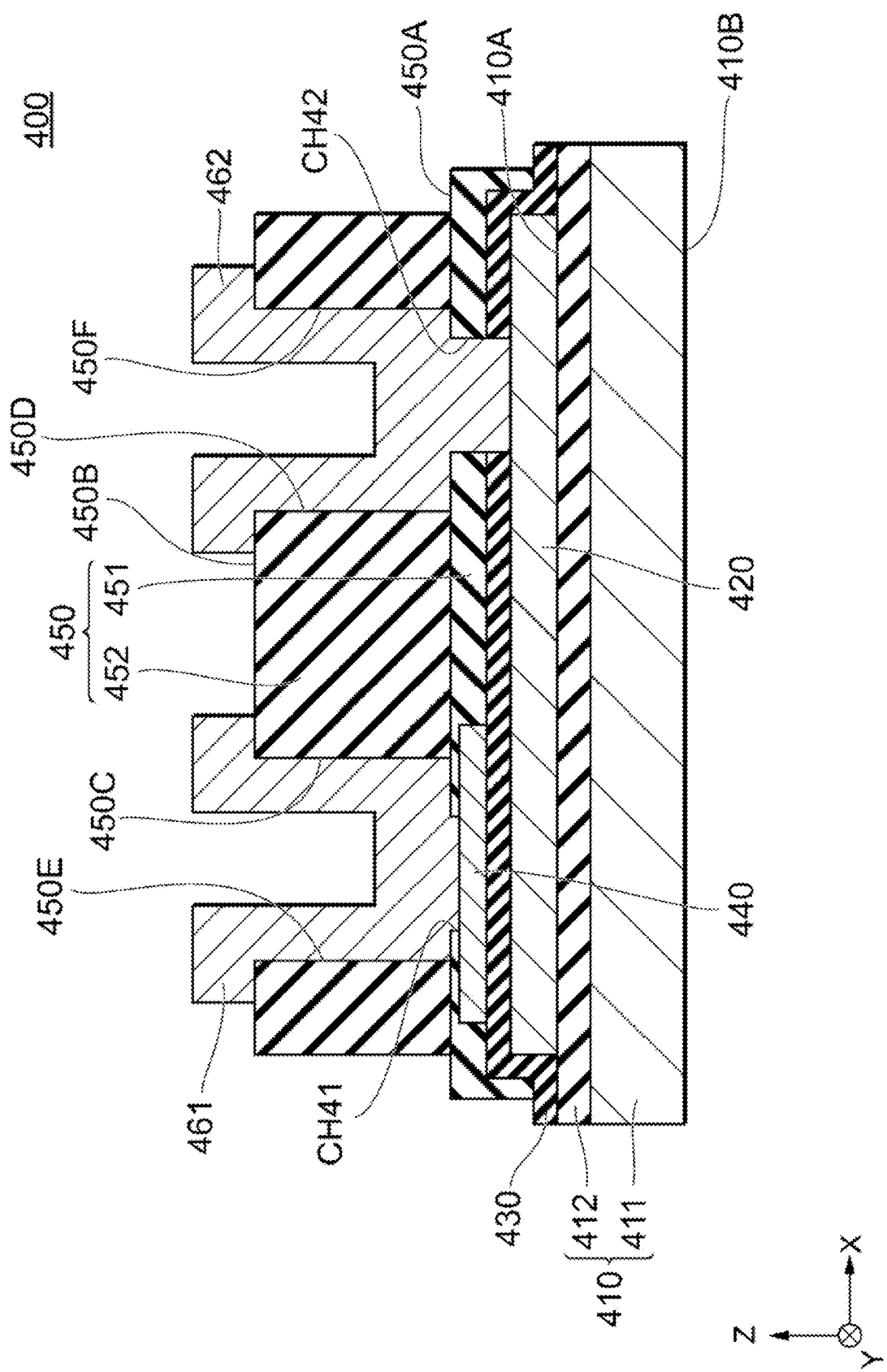
FIG. 13 is a cross-sectional view schematically showing the configuration of the thin film capacitor according to the fourth embodiment.

The configuration of a thin film capacitor 400 according to the fourth embodiment will be described with reference to FIG. 12 and FIG. 13. FIG. 12 is a plan view schematically showing the configuration of the thin film capacitor according to the fourth embodiment. FIG. 13 is a cross-sectional view schematically showing the configuration of the thin film capacitor according to the fourth embodiment. A thin film capacitor 400 includes a substrate 410 formed of a semiconductor substrate 411 and an insulating layer 412, a lower electrode 420, a dielectric film 430, an upper electrode 440, a stepped protective film 450 including a first protective film 451 and second protective films 452, a first terminal electrode 461, and a second terminal electrode 462. The substrate 410 has a first main surface 410A and a second main surface 410B. The stepped protective film 450 has a first upper surface 450A, a second upper surface 450B, and side surfaces 450C and 450D, and has a first through hole CH41 and a second through hole CH42 formed therein.

The thin film capacitor 400 according to the fourth embodiment is different from the thin film capacitor 100 according to the first embodiment in that the second protective films 452 are also provided on the opposite sides of the first through hole CH41 and the second through hole CH42 when viewed from the normal direction of the first upper surface 450A. Specifically, three second protective films 452 are provided on the first protective film 451. The three second protective films 452 each extend in the Y-axis direction, and are aligned in the X-axis direction at intervals. One of the second protective films 452 is located on a region between the first through hole CH41 and the second through hole CH42. The remaining two second protective films 452 are provided in a region outside the region between the first through hole CH41 and the second through hole CH42. Specifically, one is located on a region on the X-axis negative direction side of the first through hole CH41, and has a side surface 450E on the first through hole CH41 side. One is located on a region on the X-axis positive direction side of a second through hole HC42, and has a side surface 450F on the second through hole HC42 side. In other words, the three second protective films 452 are respectively provided on the region between the first through hole CH41 and the second through hole CH42, the region opposite to the second through hole CH42 as viewed from the first through hole CH41, and the region opposite to the first through hole CH41 as viewed from the second through hole CH42.

When viewed from the normal direction of the first upper surface 450A, in the X-axis direction in which the first through hole CH41 and the second through hole CH42 are aligned, the first through hole CH41 and the second through hole CH42 are respectively sandwiched by the second protective films 452. The side surface 450E is located on the X-axis negative direction side of the first through hole CH41, and faces the side surface 450C across the space. The side surface 450F is located on the X-axis positive direction side of the second through hole CH42 and faces the side surface 450D across the space. The first terminal electrode 461 extends also on the side surface 450E, and the second terminal electrode 462 extends also on the side surface 450F. According to this, the surface areas of the first terminal electrode 461 and the second terminal electrode 462 can be further increased. Since the surface area of the first terminal electrode can be further increased, the close contact property between the first terminal electrode and the solder can be improved. Further, when the thin film capacitor 400 is mounted, the side surface 450E and the side surface 450F can suppress the outflow of the solder to the outside in the X-axis direction, so that the mounting posture of the thin film capacitor 400 can be stabilized.

Note that, between the side surface 450C and the side surface 450E, the first upper surface 450A extends from the region overlapping the first terminal electrode 461 along the Y-axis direction.

Between the side surface 450D and the side surface 450F, the first upper surface 450A extends from the region overlapping the second terminal electrode 462 along the Y-axis direction. In other words, the first terminal electrode 461 and the second terminal electrode 462 are each preferably aligned at a same distance from the outer edge of the first upper surface 450A of the first protective film 451 in the Y-axis direction (i.e., a first direction) intersecting with the X-axis direction (i.e., a second direction) in which the first through hole CH41 and the second through hole CH42 are aligned. According to this, since the excessive amount of solder spreads out on the first upper surface 450A along the Y-axis direction at the time of mounting, the mounting posture of the thin film capacitor 400 can be stabilized.

Fifth Embodiment

Figure 14:
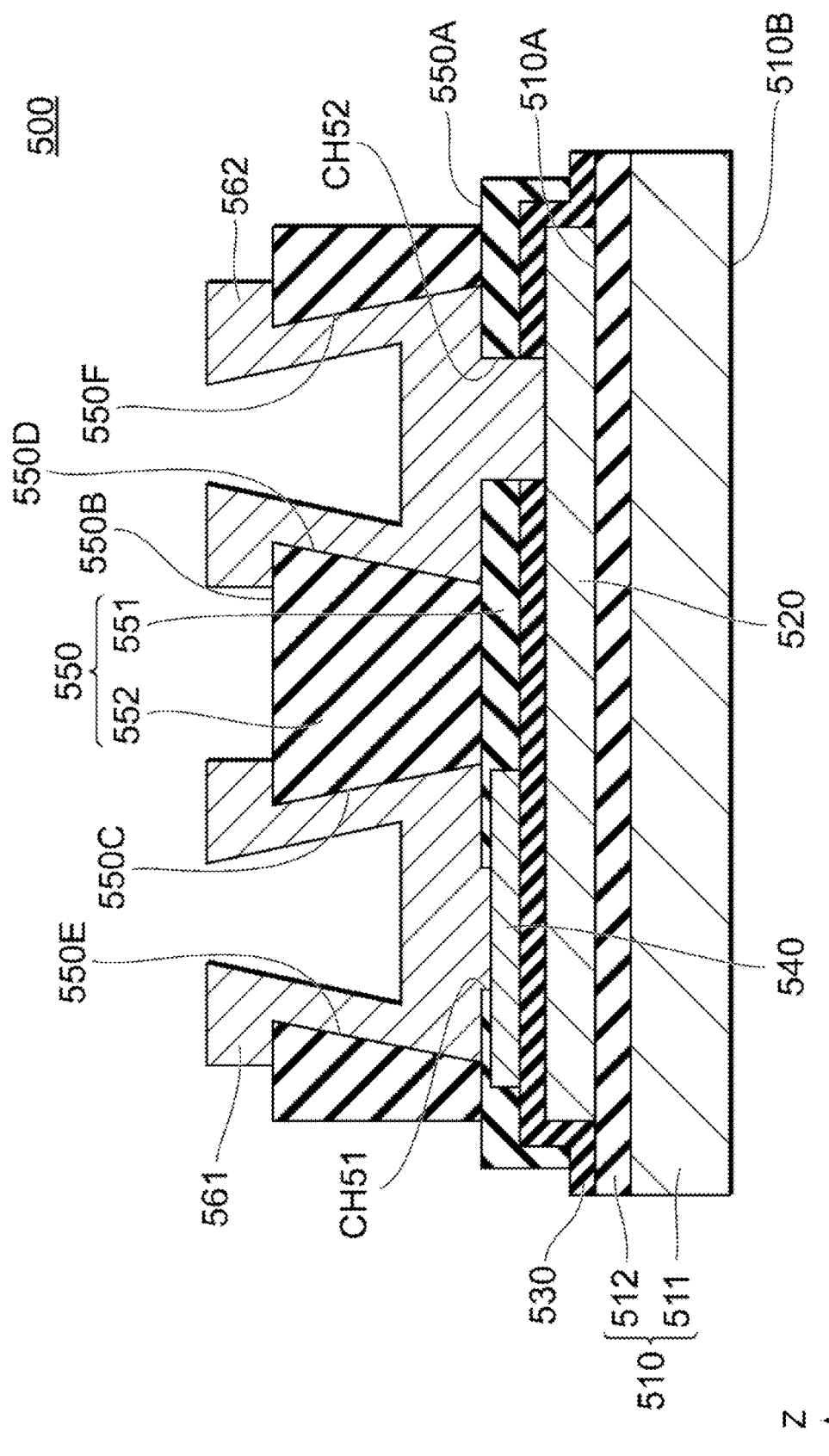
FIG. 14 is a cross-sectional view schematically showing a configuration of a thin film capacitor according to a fifth embodiment.

The configuration of a thin film capacitor 500 according to the fifth embodiment will be described with reference to FIG. 14. FIG. 14 is a cross-sectional view schematically showing the configuration of the thin film capacitor according to the fifth embodiment. The thin film capacitor 500 includes a substrate 510 formed of a semiconductor substrate 511 and an insulating layer 512, a lower electrode 520, a dielectric film 530, an upper electrode 540, a stepped protective film 550 including a first protective film 551 and a second protective film 552, a first terminal electrode 561, and a second terminal electrode 562. The substrate 510 has a first main surface 510A and a second main surface 510B. The stepped protective film 550 has a first upper surface 550A, a second upper surface 550B, and side surfaces 550C, 550D, 550E, and 550F, and has a first through hole CH51 and a second through hole CH52 formed therein.

The thin film capacitor 500 according to the fifth embodiment is different from the thin film capacitor 400 according to the fourth embodiment in that the second protective film 552 has a reverse taper shape. That is, the angle formed by the first upper surface 550A and the side surface 550C on the first terminal electrode 561 side is an acute angle, and the angle formed by the first upper surface 550A and the side surface 550E on the first terminal electrode 561 side is an acute angle. Further, the angle formed by the first upper surface 550A and the side surface 550D on the second terminal electrode 562 side is an acute angle, and the angle formed by the first upper surface 550A and the side surface 550F on the second terminal electrode 562 side is an acute angle. According to this, without increasing the area of each of the first terminal electrode 561 and the second terminal electrode 562 when viewed from the normal direction of the second upper surface 550B of the stepped protective film 550, the surface area of each of the first terminal electrode 561 and second terminal electrode 562 can be increased. In addition, it is difficult for the solder to peel due to the anchor effect, and the bonding strength of the thin film capacitor 500 to the external substrate can be improved.

Sixth Embodiment

Figure 15:
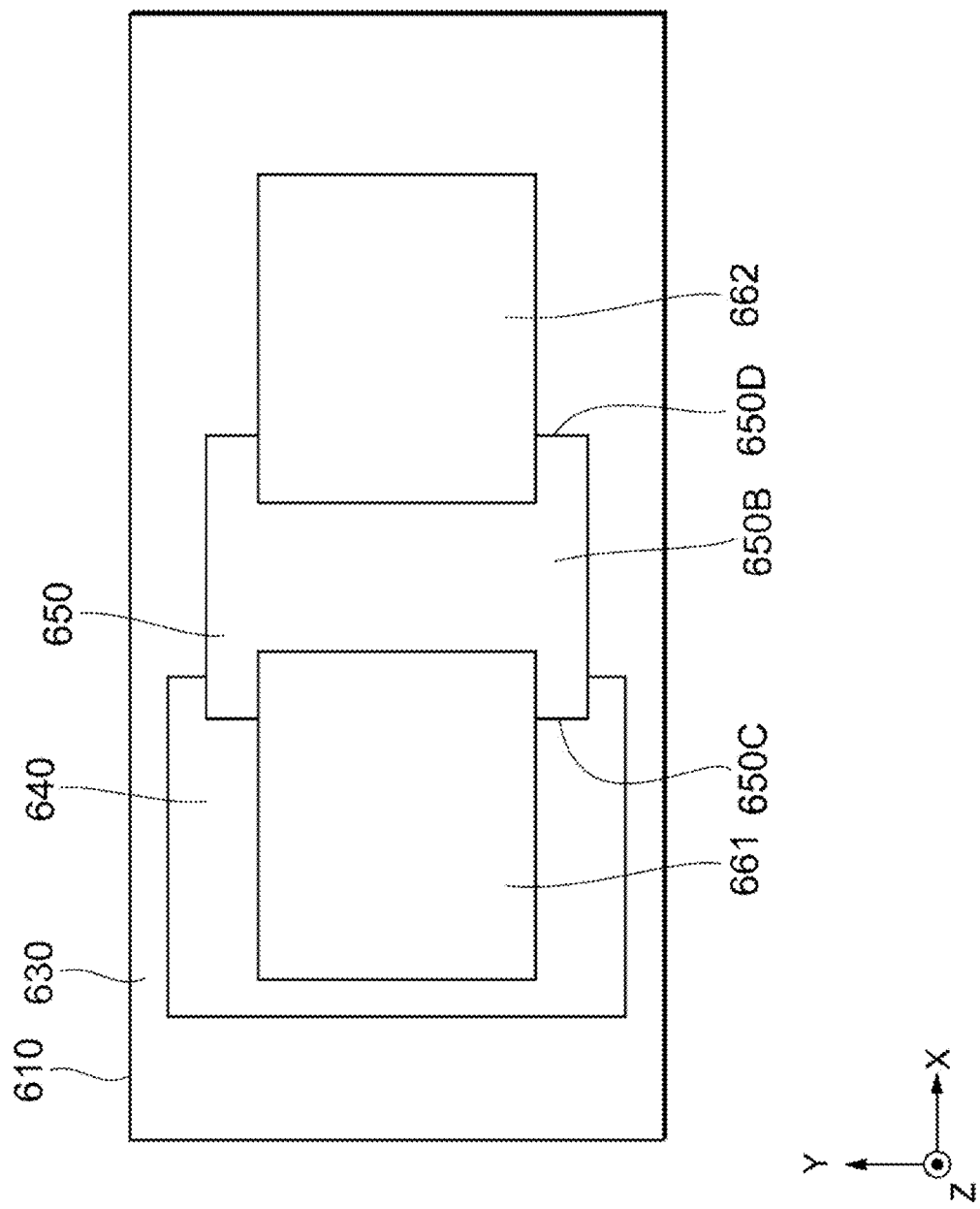
FIG. 15 is a plan view schematically showing a configuration of a thin film capacitor according to a sixth embodiment.
Figure 16:
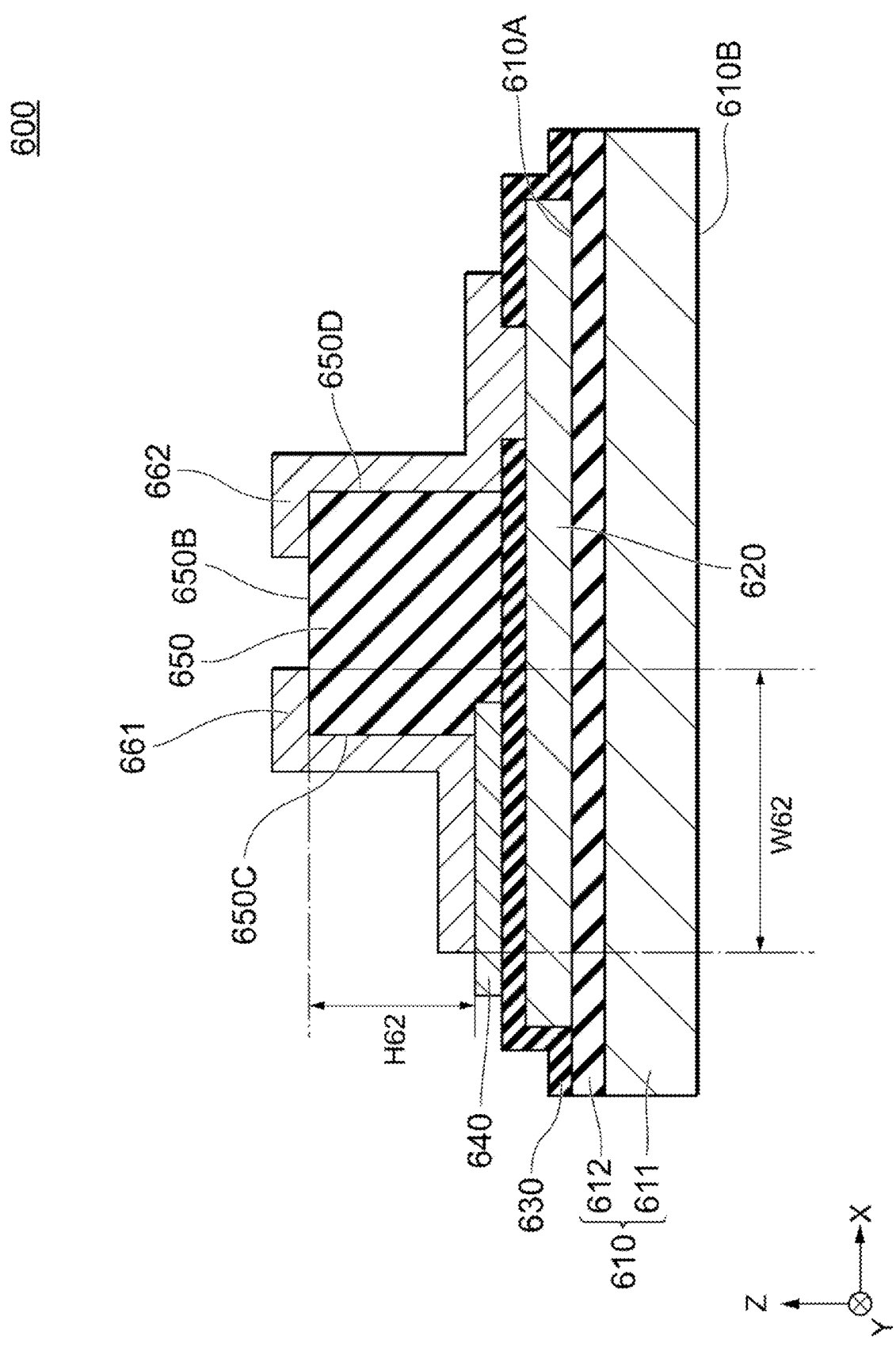
FIG. 16 is a cross-sectional view schematically showing the configuration of the thin film capacitor according to the sixth embodiment.

The configuration of a thin film capacitor 600 according to the sixth embodiment will be described with reference to FIG. 15 and FIG. 16. FIG. 15 is a plan view schematically showing the configuration of the thin film capacitor according to the sixth embodiment. FIG. 16 is a cross-sectional view schematically showing the configuration of the thin film capacitor according to the sixth embodiment. The thin film capacitor 600 includes a substrate 610 formed of a semiconductor substrate 611 and an insulating layer 612, a lower electrode 620, a dielectric film 630, an upper electrode 640, a protective film 650, a first terminal electrode 661, and a second terminal electrode 662. The substrate 610 has a first main surface 610A and a second main surface 610B. The protective film 650 has an upper surface 650B and side surfaces 650C and 650D.

The thin film capacitor 600 according to the sixth embodiment is different from the thin film capacitor 100 according to the first embodiment in that the first protective film is omitted. The protective film 650 is provided only between the first terminal electrode 661 and the second terminal electrode 662. The protective film 650 corresponds to the second protective film 152 of the thin film capacitor 100 according to the first embodiment, and the dimensions such as the height conform to this. For example, the height H62 of the side surface 650C of the protective film 650 corresponds to the height of the portion extending to the side surface 650C of the first terminal electrode 661, and is desirably 0.2 times to 2 times of the width W62 along the X-axis direction of the first terminal electrode 661 (0.2≤H62/W62≤2). Further, the height H62 is desirably 10 µm to 100 µm.

The first terminal electrode 661 extends on the upper surface of the upper electrode 640 and the side surface 650C and the upper surface 650B of the protective film 650. The second terminal electrode 662 extends on the upper surface of the dielectric film 630 and the side surface 650D and the upper surface 650B of the protective film 650, and is electrically connected to the lower electrode 620 through a through hole formed in the dielectric film 630. Since a part of the upper electrode 640 is exposed, it is desirable to have a chemically stable Au layer on the outermost surface thereof.

Thus, even with the configuration in which the first protective film is omitted and the protective film 650 is provided only between the first terminal electrode 661 and the second terminal electrode 662, when the height H62 of the protective film 650 is sufficiently high, the same effect as the first embodiment can be obtained.

Seventh Embodiment

Figure 17:
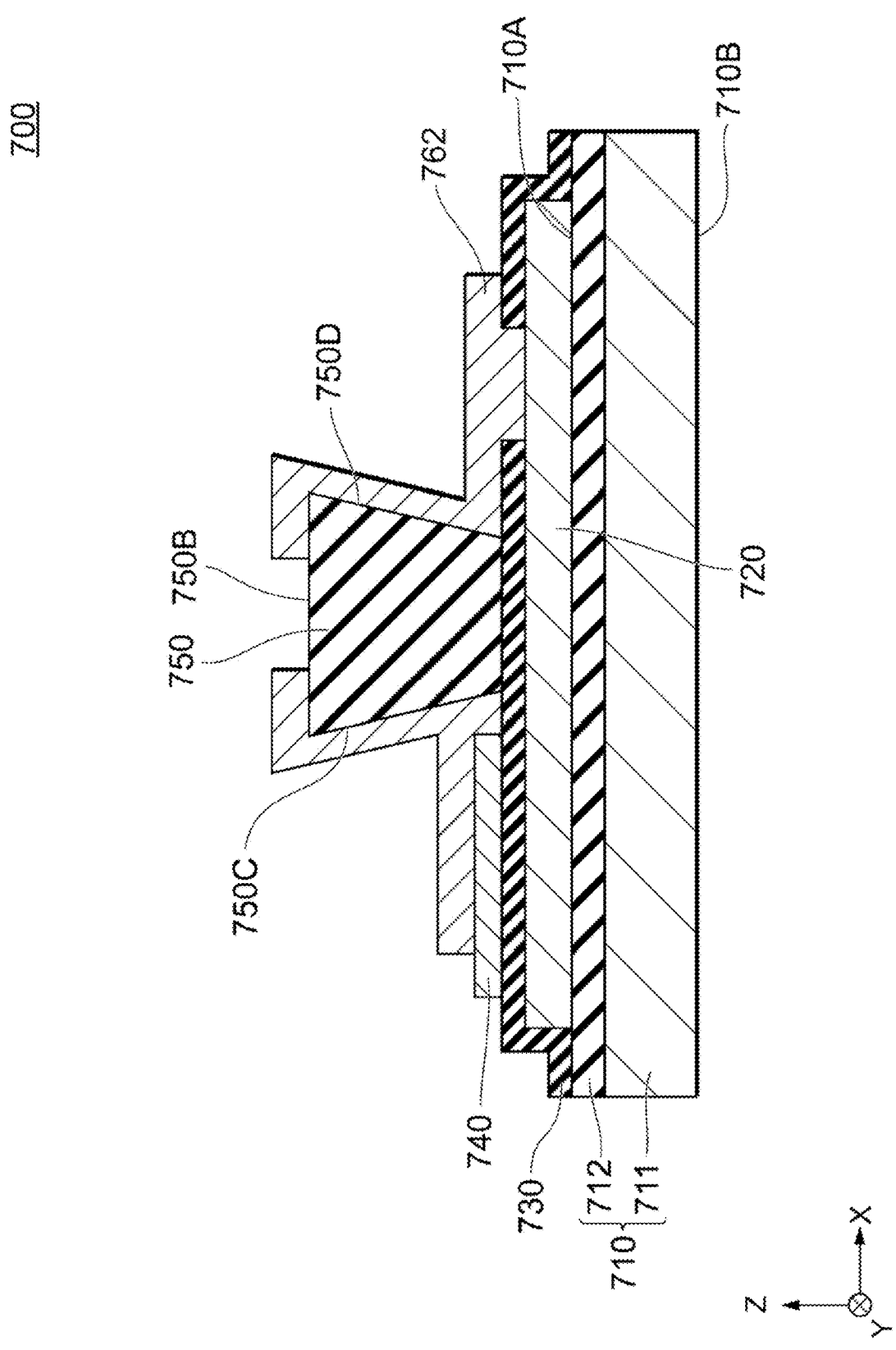
FIG. 17 is a cross-sectional view schematically showing a configuration of a thin film capacitor according to a seventh embodiment.

The configuration of a thin film capacitor 700 according to the seventh embodiment will be described with reference to FIG. 17. FIG. 17 is a cross-sectional view schematically showing the configuration of the thin film capacitor according to the seventh embodiment. The thin film capacitor 700 includes a substrate 710 formed of a semiconductor substrate 711 and an insulating layer 712, a lower electrode 720, a dielectric film 730, an upper electrode 740, a protective film 750, a first terminal electrode 761, and a second terminal electrode 762. The substrate 710 has a first main surface 710A and a second main surface 710B. The protective film 750 has an upper surface 750B and side surfaces 750C and 750D.

The thin film capacitor 700 according to the seventh embodiment is different from the thin film capacitor 600 according to the sixth embodiment in that the protective film 750 has a reverse taper shape. That is, the upper surface 750B of the protective film 750 is provided to be wider than the lower surface of the protective film 750 on the dielectric film 730 side. According to this, the same effect as the third embodiment can be obtained.

Eighth Embodiment

Figure 18:
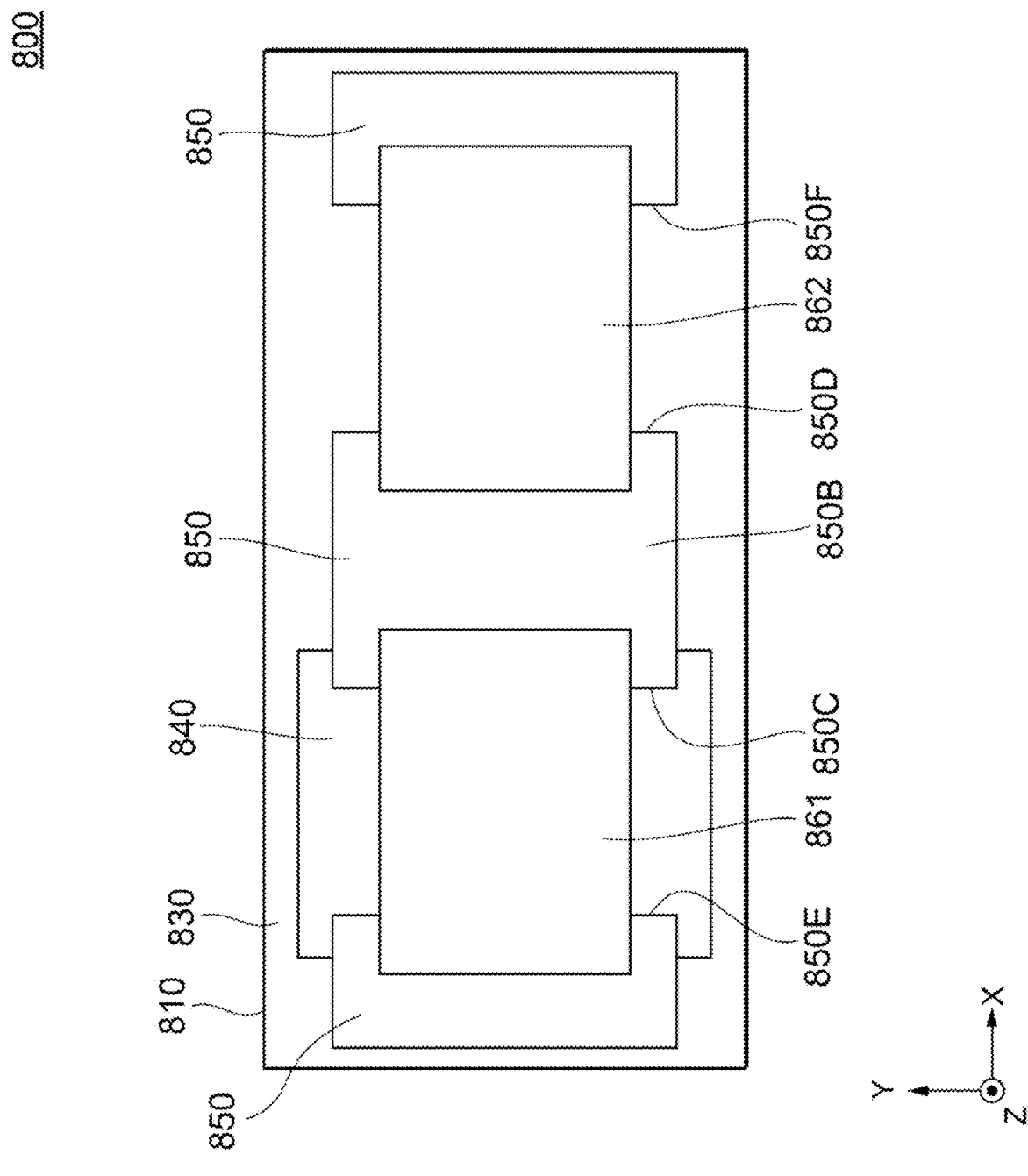
FIG. 18 is a plan view schematically showing a configuration of a thin film capacitor according to an eighth embodiment.
Figure 19:
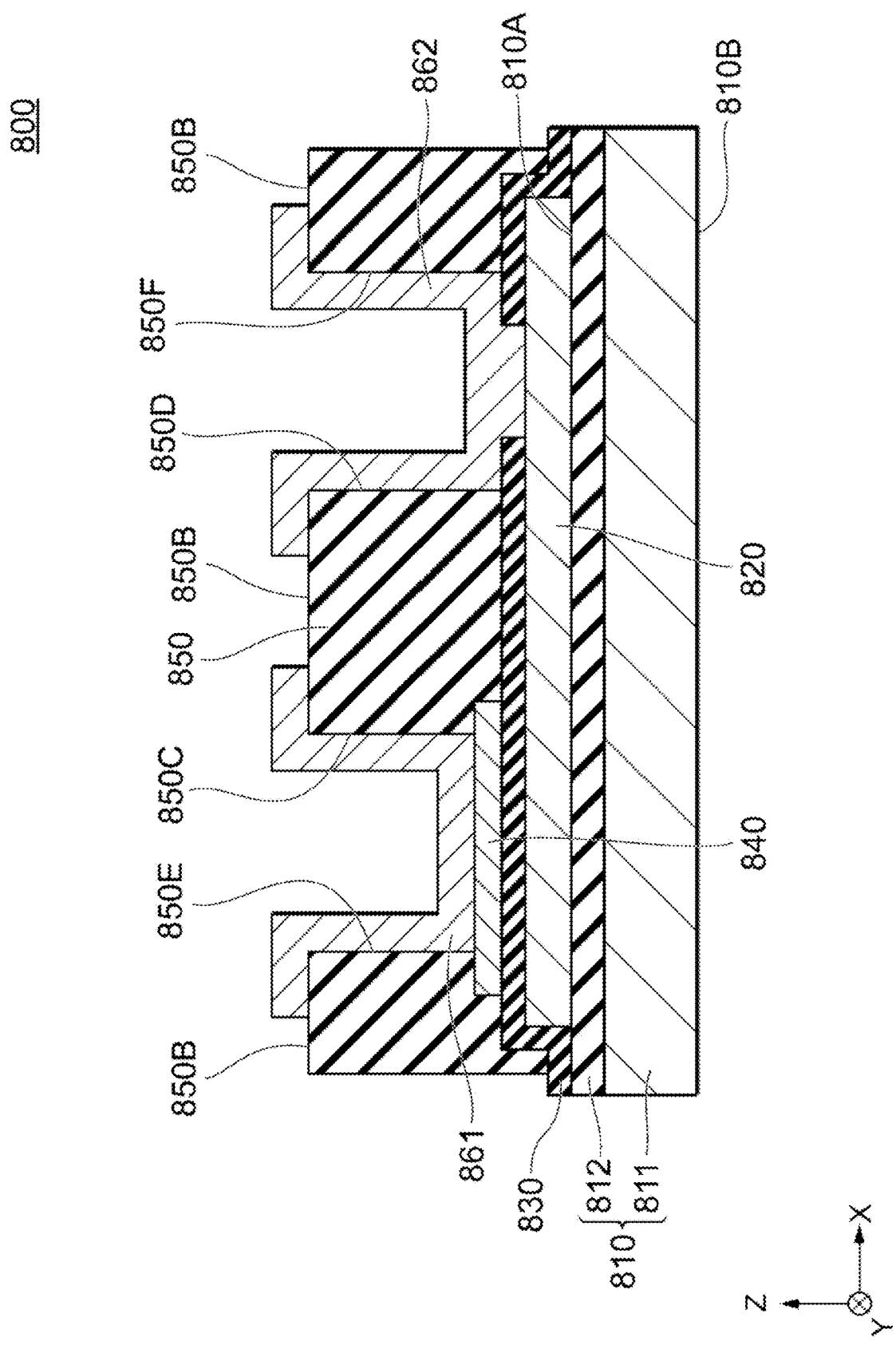
FIG. 19 is a cross-sectional view schematically showing the configuration of the thin film capacitor according to the eighth embodiment.

The configuration of a thin film capacitor 800 according to the eighth embodiment will be described with reference to FIG. 18 and FIG. 19. FIG. 18 is a plan view schematically showing the configuration of the thin film capacitor according to the eighth embodiment. FIG. 19 is a cross-sectional view schematically showing the configuration of the thin film capacitor according to the eighth embodiment. The thin film capacitor 800 includes a substrate 810 formed of a semiconductor substrate 811 and an insulating layer 812, a lower electrode 820, a dielectric film 830, an upper electrode 840, protective films 850, a first terminal electrode 861, and a second terminal electrode 862. The substrate 810 has a first main surface 810A and a second main surface 810B. The protective films 850 have an upper surface 850B and side surfaces 850C, 850D, 850E, and 850F.

The thin film capacitor 800 according to the eighth embodiment is different from the thin film capacitor 600 according to the sixth embodiment in that three protective films 850 are aligned at intervals in the X-axis direction when viewed from the normal direction of the upper surface 850B. The three protective films 850 each extend in the Y-axis direction, and the three protective films 850 have the side surface 850E that faces the side surface 850C across the space, and the side surface 850F that faces the side surface 850D across the space. The first terminal electrode 861 extends also on the side surface 850E, and the second terminal electrode 862 extends also on the side surface 850F. Between the side surface 850C and the side surface 850E, the upper electrode 840 extends from the region overlapping the first terminal electrode 861 along the Y-axis direction. Between the side surface 850D and the side surface 850F, the upper surface of the dielectric film 830 extends from the region overlapping the second terminal electrode 862 along the Y-axis direction. According to this, the same effect as the fourth embodiment can be obtained.

Ninth Embodiment

Figure 20:
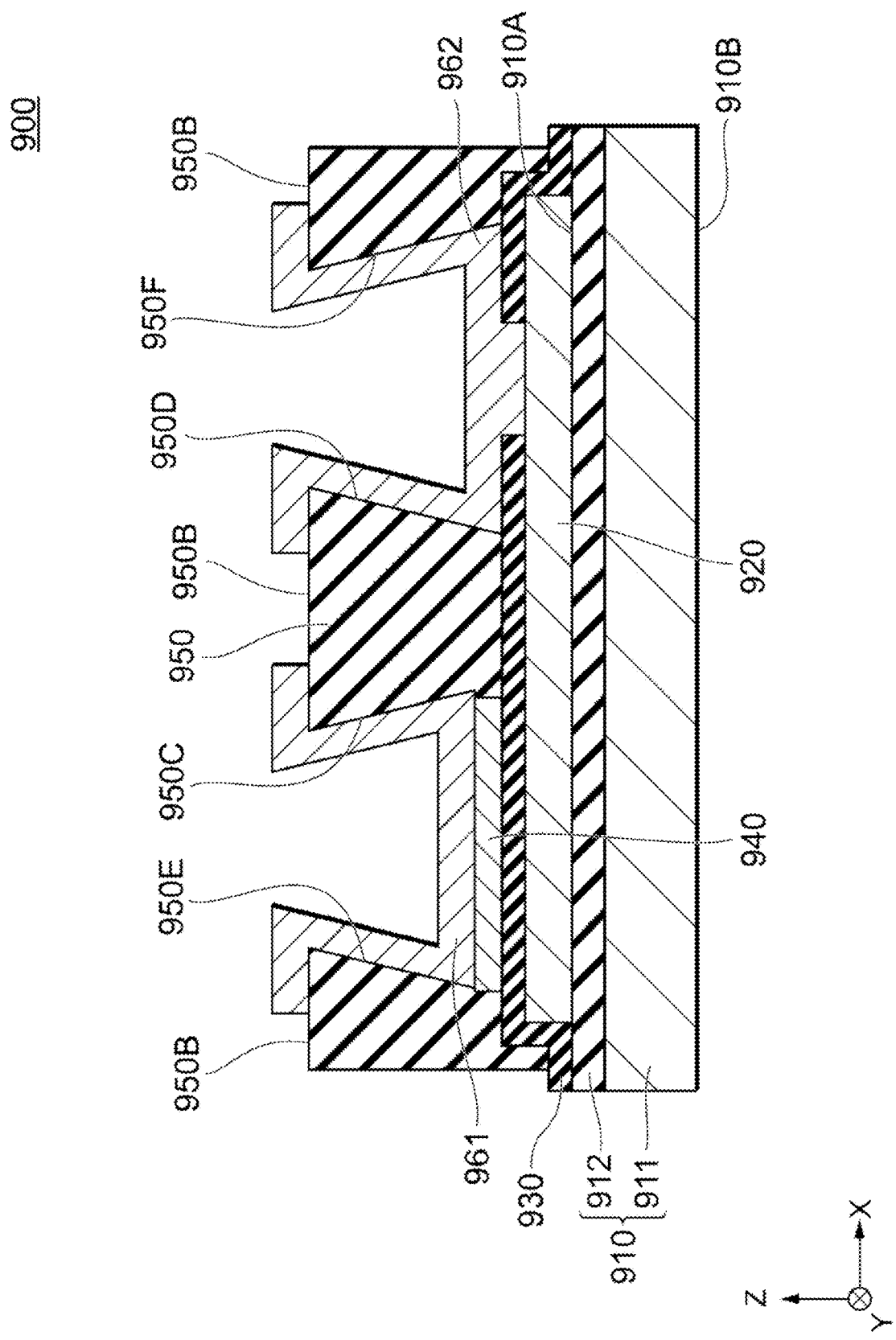
FIG. 20 is a cross-sectional view schematically showing a configuration of a thin film capacitor according to a ninth embodiment.

The configuration of a thin film capacitor 900 according to the ninth embodiment will be described with reference to FIG. 20. FIG. 20 is a cross-sectional view schematically showing the configuration of the thin film capacitor according to the ninth embodiment. The thin film capacitor 900 includes a substrate 910 formed of a semiconductor substrate 911 and an insulating layer 912, a lower electrode 920, a dielectric film 930, an upper electrode 940, a protective film 950, a first terminal electrode 961, and a second terminal electrode 962. The substrate 910 has a first main surface 910A and a second main surface 910B. The protective film 950 has an upper surface 950B and side surfaces 950C, 950D, 950E, and 950F.

The thin film capacitor 900 according to the ninth embodiment is different from the thin film capacitor 800 according to the eighth embodiment in that the protective film 950 has a reverse taper shape. That is, the angle formed by the upper surface 950B and the side surface 950C on the first terminal electrode 961 side is an obtuse angle, and the angle formed by the upper surface 950B and the side surface 950E on the first terminal electrode 961 side is an obtuse angle. Further, the angle formed by the upper surface 950B and the side surface 950D on the second terminal electrode 962 side is an obtuse angle, and the angle formed by the upper surface 950B and the side surface 950F on the second terminal electrode 962 side is an obtuse angle. According to this, the same effect as the fifth embodiment can be obtained.

The embodiments described above are for facilitating the understanding of the present invention, and are not intended to limit the present invention. The present invention can be changed/modified without departing from the spirit thereof, and the present invention includes equivalents thereof. In other words, those obtained by appropriately changing the design of each embodiment by those skilled in the art are also included in the scope of the present invention as long as they include the features of the present invention. For example, each element included in each embodiment and its arrangement, material, condition, shape, size, and the like are not limited to those illustrated, and can be changed as appropriate. In addition, each element included in each embodiment can be combined to the extent that is technically possible, and combinations thereof are included in the scope of the present invention as long as they include the features of the present invention.

LISTING OF REFERENCE SYMBOLS

- 100: thin film capacitor
- 110: substrate
- 111: semiconductor substrate
- 112: insulating layer
- 120: lower electrode
- 130: dielectric film
- 140: upper electrode
- 150: stepped protective film
- 151: first protective film
- 152: second protective film
- 150A: first upper surface
- 150B: second upper surface
- 150C, 150D: side surface
- CH11: first through hole
- CH12: second through hole
- 161: first terminal electrode
- 162: second terminal electrode
- H1, H2: height
- W1, W2: width

The invention claimed is:

1. A capacitor comprising:
    a lower electrode;
    a dielectric film on the lower electrode;
    an upper electrode facing the lower electrode with the dielectric film interposed therebetween;
    a first protective film on the dielectric film and on a surface of the upper electrode opposite to a surface thereof facing the dielectric layer, the first protective film defining a first through hole that opens to the upper electrode and a second through hole that opens to the lower electrode, and having a first upper surface that defines a first height of the first through hole and a second height of the second through hole;
    a second protective film located in a part of a region in a plan view defined by the first upper surface of the first protective film, the second protective film having a second upper surface located higher than the first upper surface of the first protective film and a side surface extending from an outer edge of the second upper surface toward the first upper surface;
    a first terminal electrode electrically connected to the upper electrode through the first through hole, the first terminal electrode extending at least from the side surface to the second upper surface of the second protective film; and
    a second terminal electrode electrically connected to the lower electrode through the second through hole, the second terminal electrode extending at least from the side surface to the second upper surface of the second protective film.

2. The capacitor according to claim 1, wherein a thickness of the second protective film is greater than the first height of the first through hole.

3. The capacitor according to claim 1, wherein a thickness of the second protective film is 2 times to 20 times that of the first height of the first through hole.

4. The capacitor according to claim 1, wherein a thickness of the second protective film is 0.2 times to 2 times of a width of the first terminal electrode or the second terminal electrode in a direction in which the first through hole and the second through hole are aligned in the plan view of the first upper surface of the first protective film.

5. The capacitor according to claim 1, wherein the second protective film is in a first location between the first through hole and the second through hole on the first upper surface of the first protective film.

6. The capacitor according to claim 5, wherein the second protective film is further in a second location outside of the first location between the first through hole and the second through hole on the first upper surface of the first protective film.

7. The capacitor according to claim 6, wherein the side surface of the second protective film has an inversely tapered shape extending from the first upper surface to the second upper surface.

8. The capacitor according to claim 1, wherein the side surface of the second protective film has an inversely tapered shape extending from the first upper surface to the second upper surface.

9. The capacitor according to claim 1, wherein the first protective film and the second protective film are integral films.

10. The capacitor according to claim 1, wherein the first protective film and the second protective film are separate films.

11. The capacitor according to claim 1, wherein, in the plan view of the first upper surface of the first protective film, the first terminal electrode and the second terminal electrode are each aligned at a same distance from an outer edge of the first upper surface in a first direction intersecting with a second direction in which the first through hole and the second through hole are aligned.

12. A capacitor comprising:
a lower electrode;
a dielectric film on the lower electrode;
an upper electrode facing the lower electrode with the dielectric film interposed therebetween; a protective film on the dielectric film and on a surface of the upper electrode opposite to a surface thereof facing the dielectric layer, the protective film having an upper surface located higher than an upper surface of the dielectric film, and a side surface extending from an outer edge of the upper surface of the protective film toward the upper surface of the dielectric film;
a first terminal electrode electrically connected to the upper electrode through a first through hole and extending at least from the side surface to the upper surface of the protective film; and
a second terminal electrode electrically connected to the lower electrode through a second through hole and extending at least from the side surface to the upper surface of the protective film, wherein a thickness of the protective film above the upper electrode is 0.2 times to 2 times of a width of the first terminal electrode or the second terminal electrode in a direction in which the first terminal electrode and the second terminal electrode are aligned in a plan view of the capacitor.

13. The capacitor according to claim 12, wherein the protective film is in a first location between the first terminal electrode and the second terminal electrode.

14. The capacitor according to claim 13, wherein the protective film is further in a second location outside of the first location between the first terminal electrode and the second terminal electrode.

15. The capacitor according to claim 14, wherein the side surface of the protective film has an inversely tapered shape extending from the dielectric layer to the upper surface of the protective film.

16. The capacitor according to claim 12, wherein the side surface of the second protective film has an inversely tapered shape extending from the dielectric layer to the upper surface of the protective film.

17. A method of manufacturing a capacitor, the method comprising:
providing a lower electrode;
covering the lower electrode with a dielectric film;
providing an upper electrode on the dielectric film so as to face the lower electrode;
providing a first protective film on the dielectric film and on a surface of the upper electrode opposite to a surface thereof facing the dielectric layer, the first protective film defining a first through hole that opens to the upper electrode and a second through hole that opens to the lower electrode, and having a first upper surface that defines a first height of the first through hole and a second height of the second through hole;
providing a second protective film in a part of a region in a plan view defined by the first upper surface of the first protective film, the second protective film having a second upper surface located higher than the first upper surface of the first protective film and a side surface extending from an outer edge of the second upper surface toward the first upper surface; and
electrically connecting a first terminal electrode and a second terminal electrode to the upper electrode and the lower electrode through the first through hole and the second through hole, respectively, each of the first terminal electrode and the second terminal electrode extending at least from the side surface to the second upper surface of the second protective film.

\* \* \* \* \*